(12) United States Patent
Huang et al.

(10) Patent No.: US 10,872,810 B2
(45) Date of Patent: Dec. 22, 2020

(54) FIN FIELD EFFECT TRANSISTOR DEVICE STRUCTURE AND METHOD FOR FORMING THE SAME

(71) Applicant: Taiwan Semiconductor Manufacturing Co., Ltd., Hsinchu (TW)

(72) Inventors: Lin-Yu Huang, Hsinchu (TW); Jia-Chuan You, Dayuan Township, Taoyuan County (TW); Chia-Hao Chang, Hsinchu (TW); Tien-Lu Lin, Hsinchu (TW); Yu-Ming Lin, Hsinchu (TW); Chih-Hao Wang, Baoshan Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/353,421

(22) Filed: Mar. 14, 2019

(65) Prior Publication Data
US 2020/0294846 A1    Sep. 17, 2020

(51) Int. Cl.
| H01L 21/768 | (2006.01) |
| H01L 29/78 | (2006.01) |
| H01L 29/66 | (2006.01) |
| H01L 29/417 | (2006.01) |

(52) U.S. Cl.
CPC .... *H01L 21/7682* (2013.01); *H01L 21/76804* (2013.01); *H01L 21/76831* (2013.01); *H01L 21/76832* (2013.01); *H01L 29/41791* (2013.01); *H01L 29/66795* (2013.01); *H01L 29/785* (2013.01)

(58) Field of Classification Search
CPC ............ H01L 29/4991; H01L 29/6653; H01L 21/7682
See application file for complete search history.

(56) References Cited

U.S. PATENT DOCUMENTS

| 6,001,726 A | 12/1999 | Nagabushnam et al. |
| 8,772,109 B2 | 7/2014 | Colinge |
| 8,785,285 B2 | 7/2014 | Tsai et al. |
| 8,816,444 B2 | 8/2014 | Wann et al. |

(Continued)

OTHER PUBLICATIONS

U.S. Notice of Allowance dated Sep. 23, 2020 for U.S. Appl. No. 16/571,684.

*Primary Examiner* — Thomas L Dickey
(74) *Attorney, Agent, or Firm* — Birch, Stewart, Kolasch & Birch, LLP

(57) ABSTRACT

A method for forming a fin field effect transistor device structure includes forming fin structures over a substrate. The method also includes forming a gate structure across the fin structures. The method also includes forming source/drain epitaxial structures over the fin structures. The method also includes forming blocking structures between the source/drain epitaxial structures. The method also includes depositing contact structures over the source/drain epitaxial structures and between the blocking structures. The method also includes removing a top portion of the blocking structures. The method also includes depositing an etch stop layer over the blocking structures and the contact structures, so that an air gap is formed between the etch stop layer and the blocking structure.

20 Claims, 43 Drawing Sheets

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,608,065 B1 * | 3/2017 | Bergendahl ....... H01L 29/66545 |
| 2019/0164960 A1 | 5/2019 | Chen et al. |

* cited by examiner

FIN FIELD EFFECT TRANSISTOR DEVICE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
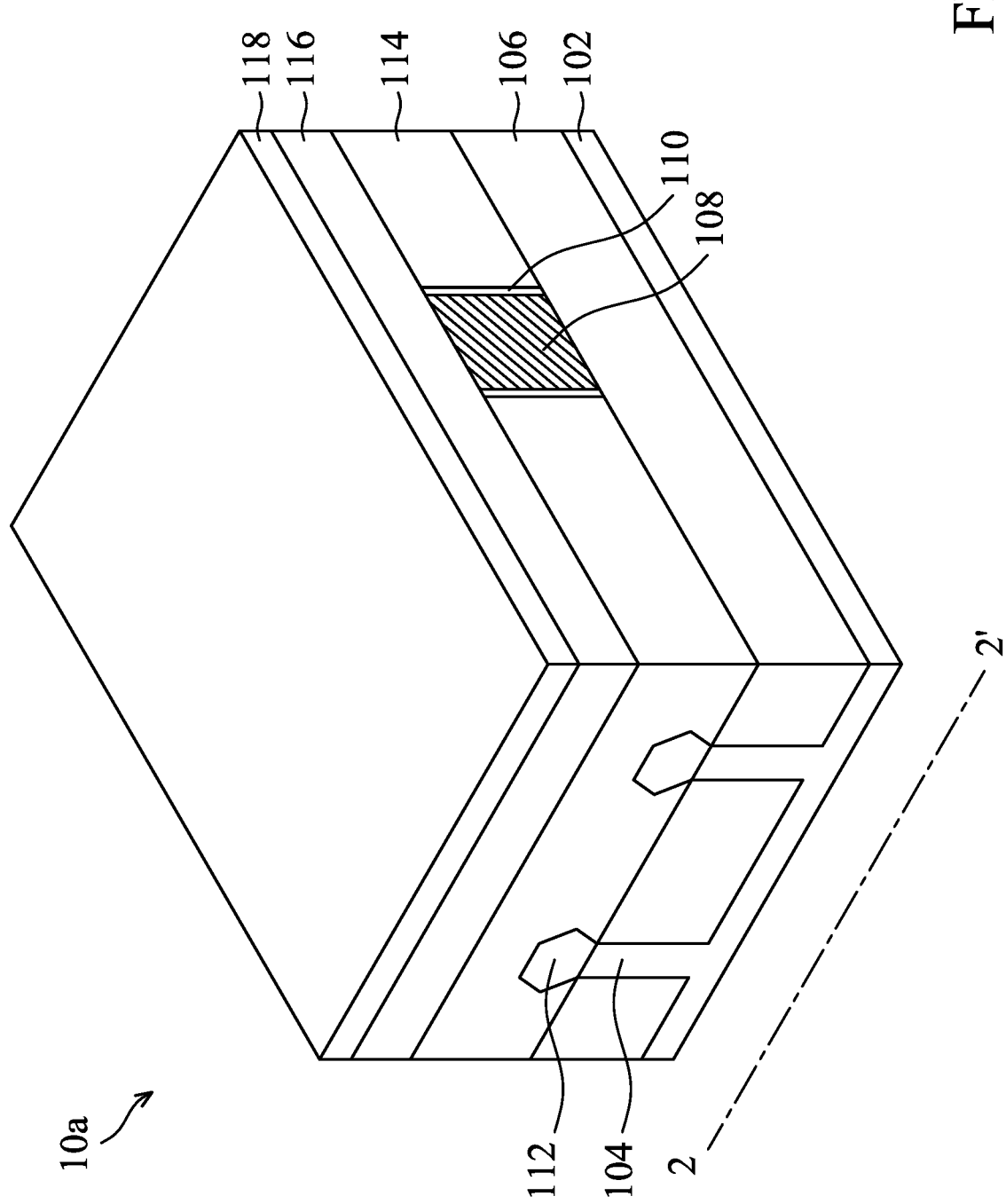
FIGS. 1A-1L are perspective representations of various stages of forming a FinFET device structure, in accordance with some embodiments of the disclosure.
Figure 1B:
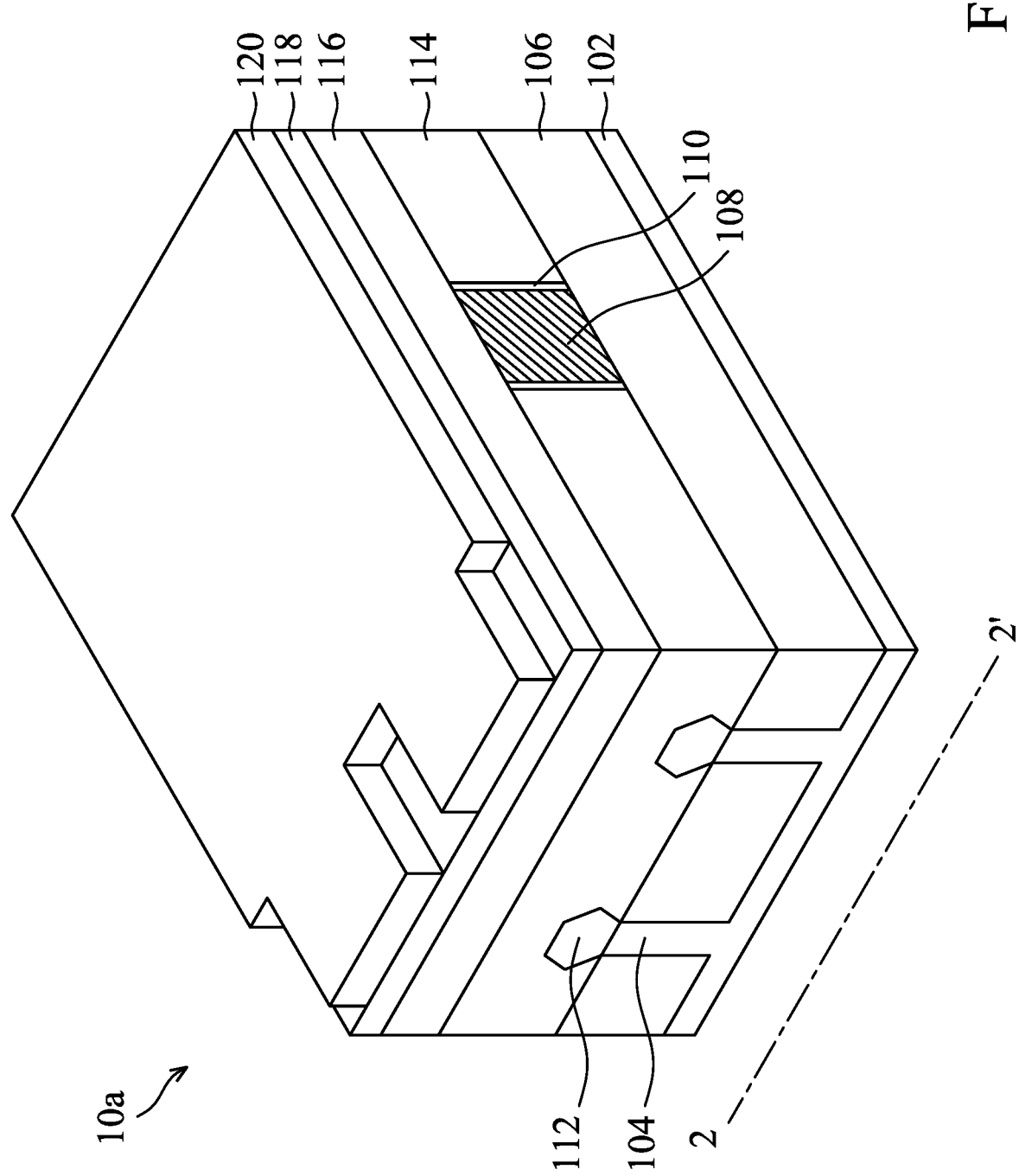
Figure 1C:
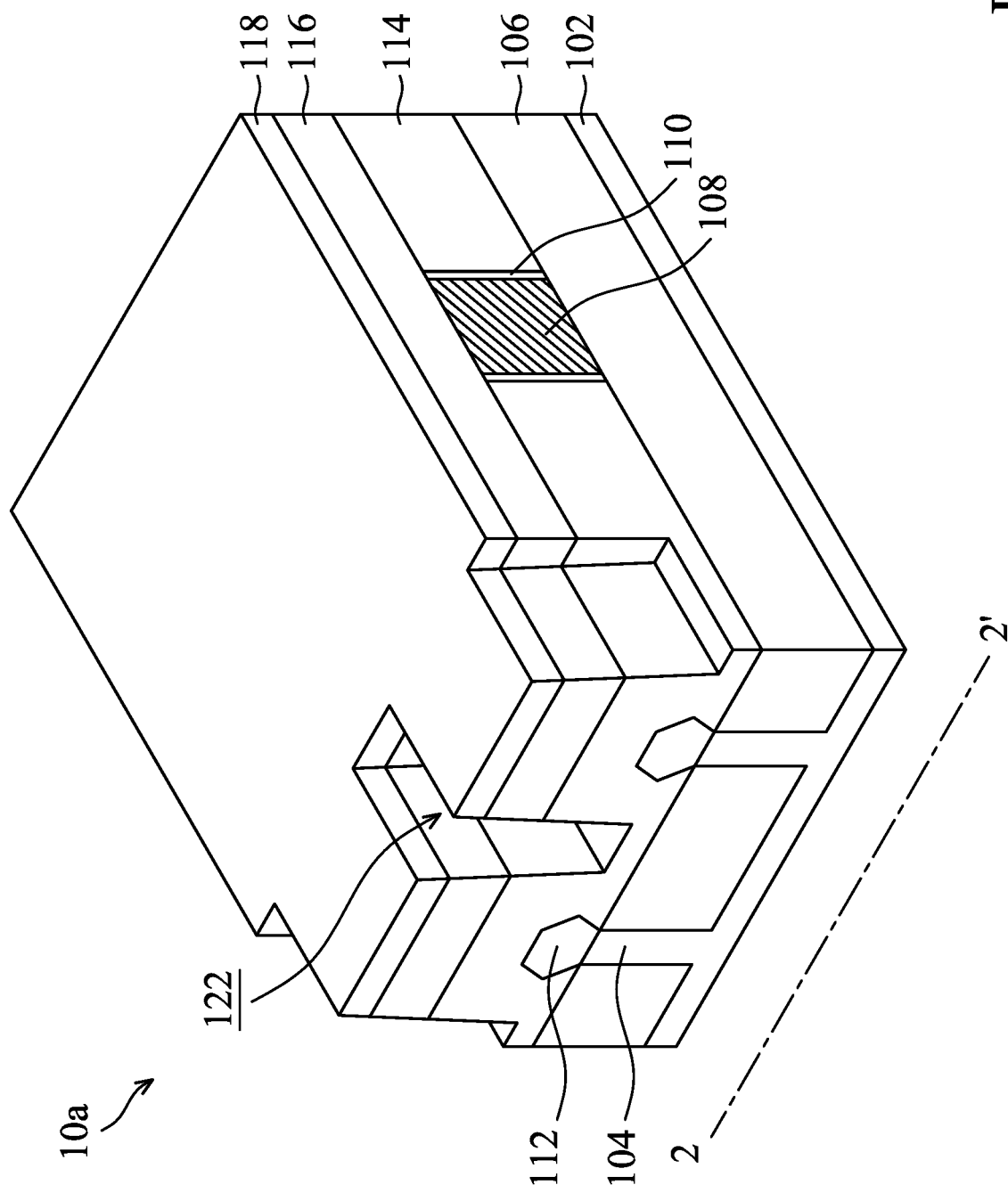

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a fin field effect transistor (FinFET) device structure are provided. The method for forming the FinFET device structure may include forming an air gap between the contact structures. The capacitance between the contact structures may be reduced. The reliability may be also improved since the leakage path may be blocked by the air gap. In addition, a blocking structure between the contact structures provides thicker mask layer while forming contact structures. Therefore, the isolation between the contact structures may be improved.

FIGS. 1A-1L are perspective representations of various stages of forming a FinFET device structure 10a, in accordance with some embodiments of the disclosure. FIGS. 2A-2L are cross-sectional representations of various stages of forming a FinFET device structure 10a shown in FIGS. 1A-1L, in accordance with some embodiments of the disclosure. FIGS. 2A-2L show cross-sectional representations taken along line 2-2' in FIGS. 1A-1L.

Figure 2A:
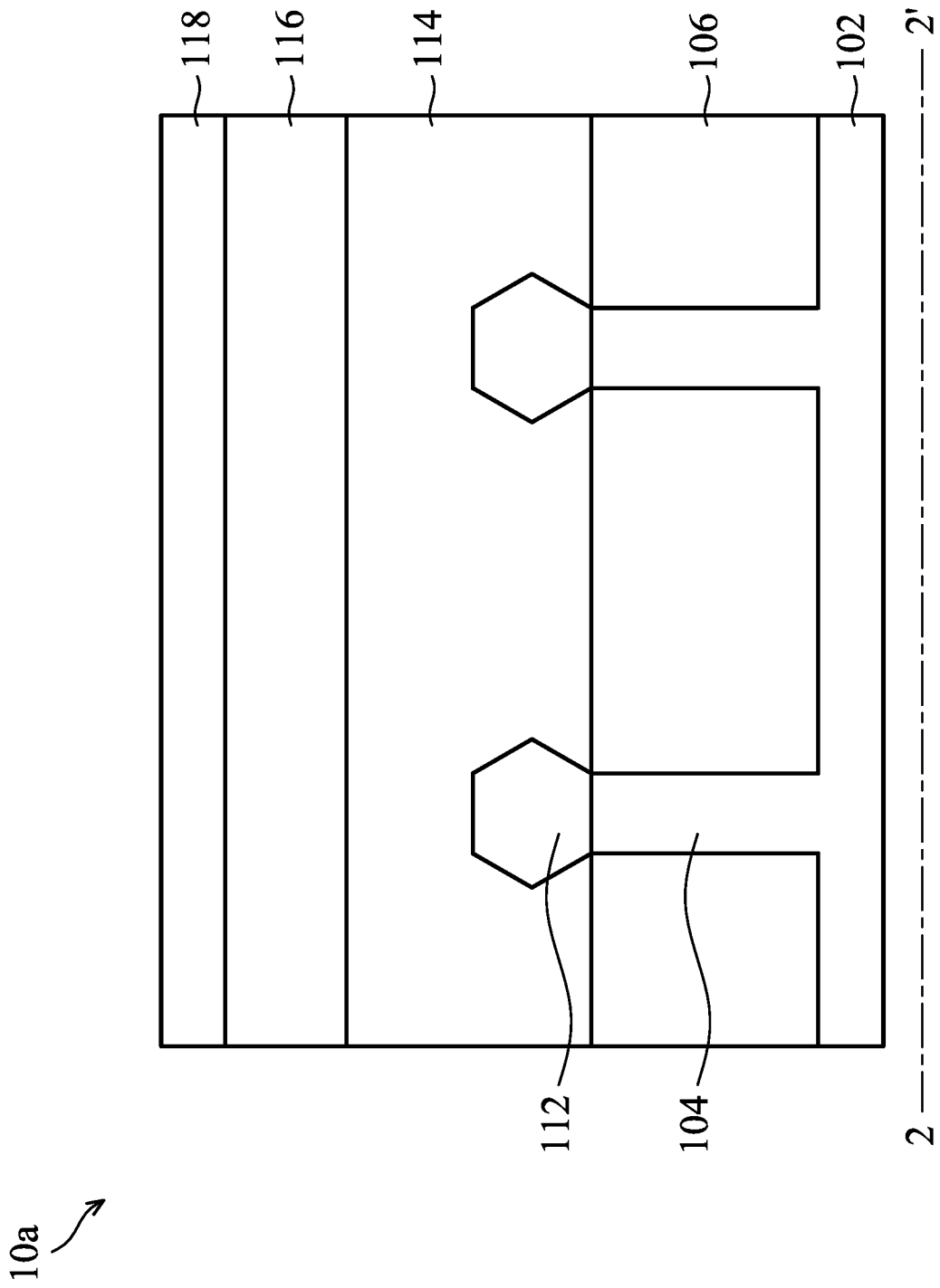
FIGS. 2A-2L are cross-sectional representations of various stages of forming a FinFET device structure shown in FIGS. 1A-1L, in accordance with some embodiments of the disclosure.
Figure 2B:
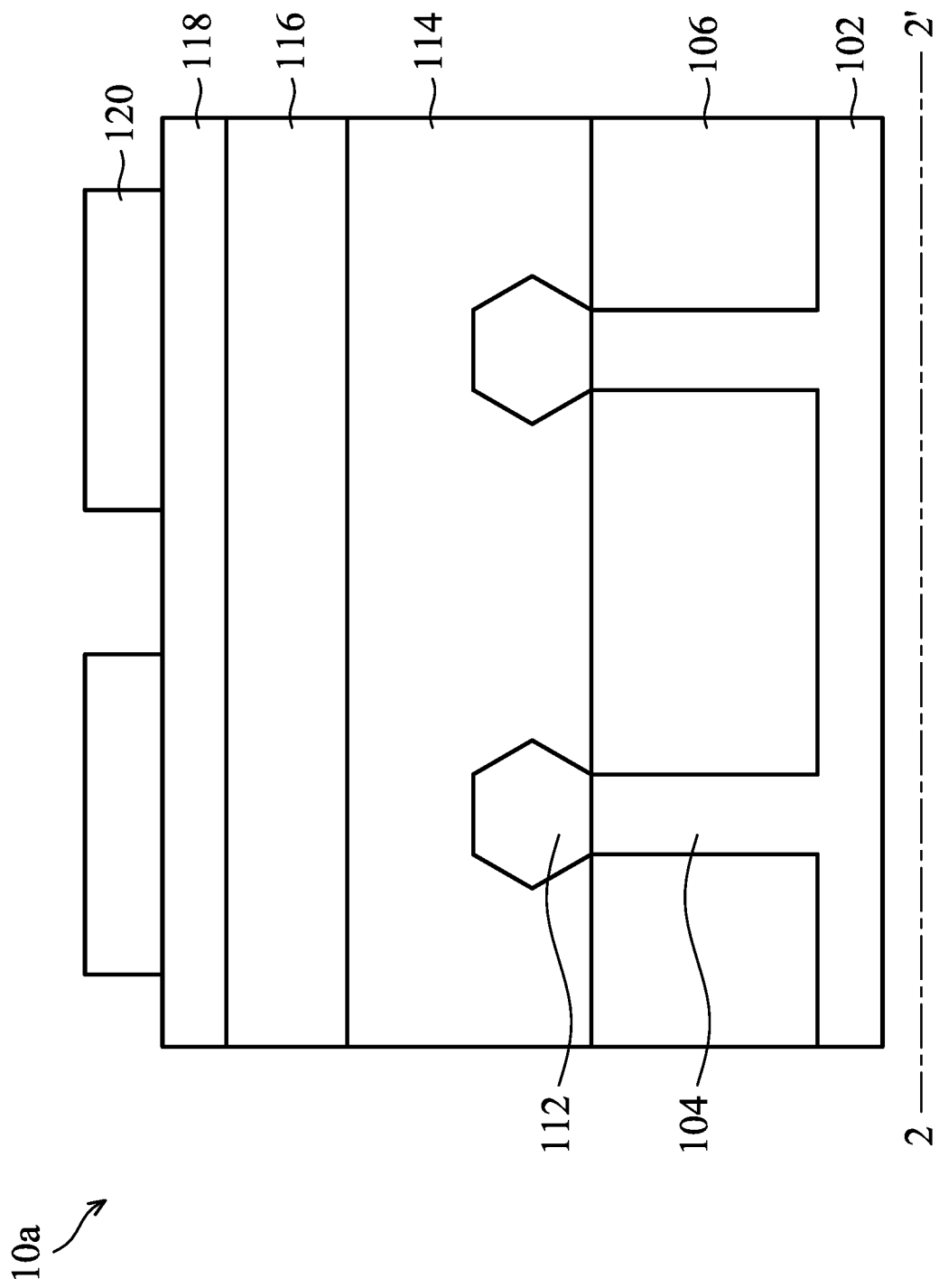
Figure 2C:
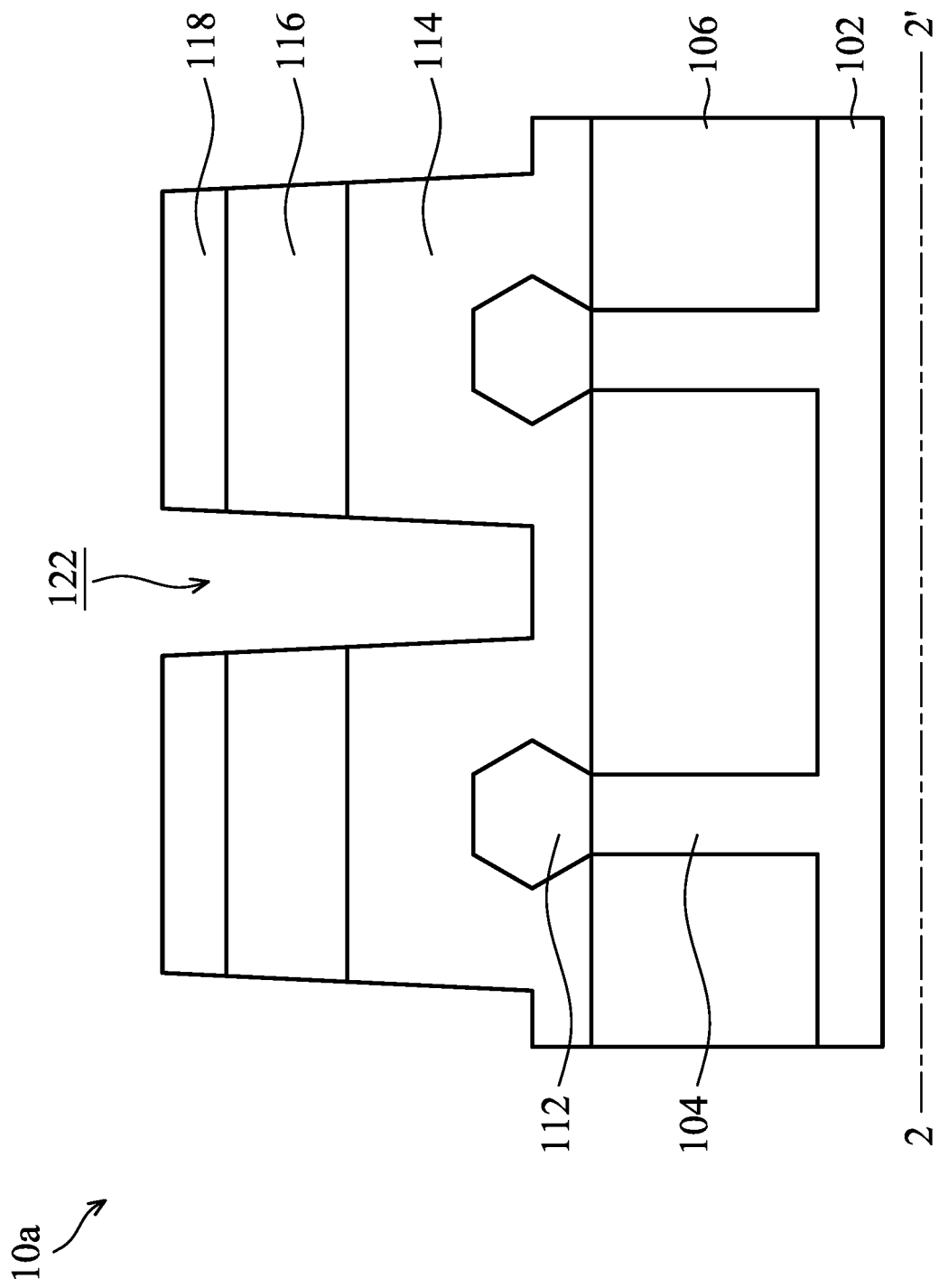

A substrate 102 is provided as shown in FIGS. 1A and 2A in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the substrate 102 includes an epitaxial layer. For example, the substrate 102 has an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, a pad layer may be blanketly formed over the substrate 102, and a hard mask layer may be blanketly formed over the pad layer (not shown). The pad layer may be a buffer layer between the substrate 102 and the hard mask layer. In addition, the pad layer may be used as a stop layer when the hard mask layer is removed. The pad layer may be made of silicon oxide. The hard mask layer may be made of silicon oxide, silicon nitride, silicon oxynitride, or another applicable material. The pad layer and the hard mask layer may be formed by deposition processes, such as a chemical vapor deposition (CVD) process, a high-density plasma chemical vapor deposition (HDPCVD) process, a spin-on process, a sputtering process, or another applicable process.

Afterwards, a photoresist layer may be formed over the hard mask layer (not shown). The photoresist layer may be patterned by a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. As a result, a patterned pad layer and a patterned hard mask layer may be obtained. Afterwards, the patterned photoresist layer may be removed.

Afterwards, an etching process is performed on the substrate 102 to form a fin structure 104 by using the hard mask layer as a mask as shown in FIGS. 1A and 2A in accordance with some embodiments. The etching process may be a dry etching process or a wet etching process. In some embodiments, the substrate 102 is etched by a dry etching process. The dry etching process may include using a fluorine-based etchant gas, such as $SF_6$, $C_xF_y$ (where x and y may be positive integers), $NF_3$, or a combination thereof. The etching process may be a time-controlled process, and continue until the fin structure 104 reaches a predetermined height.

Next, a liner layer may be conformally formed on the sidewalls and the top surface of the fin structure 104 (not shown). The liner layer may be used to protect the fin structure 104 from being damaged in the following processes (such as an anneal process or an etching process). In some embodiments, the liner layer is made of silicon nitride.

Next, an isolation layer 106 is formed to cover the fin structure 104 and the substrate 102 as shown in FIGS. 1A and 2A in accordance with some embodiments, In some embodiments, the isolation layer 106 is made of silicon oxide, silicon nitride, silicon oxynitride, fluoride-doped silicate glass (FSG), or another low-k dielectric material. The isolation layer 106 may be deposited by a deposition process, such as a chemical vapor deposition (CVD) process, a spin-on-glass process, or another applicable process.

Afterwards, the isolation layer 106 may be planarized to expose the top surface of the patterned hard mask layer (not shown). The isolation layer 106 may be planarized by a chemical mechanical polishing (CMP) process. Afterwards, the patterned hard mask layer may be removed. The patterned hard mask layer may be removed by a wet etching process. The wet etching process may include using a phosphoric acid ($H_3PO_4$) etching solution.

Next, an etching process is performed on the isolation layer 106, as shown in FIGS. 1A and 2A in accordance with some embodiments. The etching process may be used to remove a portion of the liner layer and a portion of the isolation layer 106. As a result, the top portion of the fin structure 104 may be exposed and the remaining isolation layer 106 may surround the base portion of the fin structure 104. The remaining isolation layer 106 may be an isolation structure 106 such as a shallow trench isolation (STI) structure surrounding the base portion of the fin structure 104. The isolation structure 106 may be configured to prevent electrical interference or crosstalk.

Next, a gate structure 108 is formed over and across the fin structures 104, as shown in FIG. 1A in accordance with some embodiments. In some embodiments, the gate structure 108 includes a gate dielectric layer and a gate electrode layer (not shown). In some embodiments, the gate dielectric layer is a dummy gate dielectric layer and the gate electrode layer is a dummy gate electrode layer. The dummy gate dielectric layer and the dummy gate electrode layer may be replaced by the following steps to form a real gate structure with a high-k dielectric layer and a metal gate electrode layer.

The gate dielectric layer may include silicon oxide. The silicon oxide may be formed by an oxidation process (e.g., a dry oxidation process, or a wet oxidation process), a chemical vapor deposition process, other applicable processes, or a combination thereof. Alternatively, the gate dielectric layer may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, (Ba, Sr)$TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The gate electrode layer may include polycrystalline-silicon (poly-Si), poly-crystalline silicon-germanium (poly-SiGe), metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, and tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), other applicable materials, or a combination thereof. The gate electrode layer may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Afterwards, an etching process may be performed on the gate dielectric layer and the gate electrode layer to form the gate structure 108 by using a patterned photoresist layer as a mask (not shown). The etching process may be a dry etching process or a wet etching process. In some embodiments, the gate dielectric layer and the gate electrode layer are etched by a dry etching process. The dry etching process may include using a fluorine-based etchant gas, such as $SF_6$, $C_xF_y$ (where x and y may be positive integers), $NF_3$, or a combination thereof. After the etching process, the top portion of the fin structure 104 may be exposed on the opposite sides of the gate structure 108.

Next, a pair of spacers 110 are formed on opposite sidewalls of the gate structure 108, as shown in FIG. 1A in accordance with some embodiments. The spacers 110 may be made of silicon oxide, silicon nitride, silicon oxynitride, and/or dielectric materials. In some embodiments, the spacers 110 are formed by a chemical vapor deposition (CVD) process, a spin-on-glass process, or another applicable process.

Afterwards, the top portion of the fin structure 104 exposed on the opposite sides of the gate structure 108 may be removed by an etching process to form a recess (not shown). The etching process may be a dry etching process or a wet etching process. The fin structures 104 may be etched by a dry etching process. The dry etching process may include using a fluorine-based etchant gas, such as $SF_6$, $C_xF_y$ (where x and y may be positive integers), $NF_3$, or a combination thereof.

Next, a source/drain epitaxial structure 112 is formed in the recess over the fin structure 104 on opposite sides of the gate structure 108, as shown in FIGS. 1A and 2A in accordance with some embodiments. A strained material may be grown in the recess by an epitaxial (epi) process to form the source/drain epitaxial structure 112. In addition, the lattice constant of the strained material may be different from the lattice constant of the substrate 102. The source/drain epitaxial structure 112 may include Ge, SiGe, InAs, InGaAs, InSb, GaAs, GaSb, InAlP, InP, SiC, SiP, other applicable materials, or a combination thereof. The source/drain epitaxial structure 112 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

After the source/drain epitaxial structure 112 is formed, a first inter-layer dielectric (ILD) structure 114 is formed to cover the source/drain epitaxial structure 112, as shown in FIGS. 1A and 2A in accordance with some embodiments. In some embodiments, the first ILD structure 114 surrounds the fin structures 104 and the source/drain epitaxial structures 112.

The first ILD structure 114 may include multilayers made of multiple dielectric materials, such as silicon oxide, silicon nitride, silicon oxynitride, phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The first ILD structure 114 may be formed by chemical vapor deposition (CVD), spin-on coating, or other applicable processes.

Afterwards, a planarizing process is performed on the first ILD structure 114 until the top surface of the gate structure 108 is exposed, as shown in FIG. 1A in accordance with some embodiments. After the planarizing process, the top surface of the gate structure 108 may be substantially level with the top surfaces of the spacers 110 and the first ILD structure 114. The planarizing process may include a grinding process, a chemical mechanical polishing (CMP) process, an etching process, other applicable processes, or a combination thereof.

Next, a second ILD structure 116 is blanketly formed over the first ILD structure 114 and the gate structure 108, as shown in FIGS. 1A and 2A in accordance with some embodiments. The processes for forming the second ILD structure 116 may be the same as, or similar to, those used to form the first ILD structure 114. For the purpose of brevity, the descriptions of these processes are not repeated herein.

Next, a hard mask layer 118 is blanketly formed over the second ILD structure 116, as shown in FIGS. 1A and 2A in accordance with some embodiments. The processes for forming the hard mask layer 118 may be the same as, or similar to, those used to form the hard mask layer for forming the fin structure 112. For the purpose of brevity, the descriptions of these processes are not repeated herein.

Afterwards, a patterning and an etching process are performed to form an opening 122 by using a patterned photoresist layer 120 as a mask, as shown in FIGS. 1B, 2B, 1C and 2C in accordance with some embodiments. The patterning process may include a photolithography process and an etching process. Examples of photolithography processes may include photoresist coating, soft baking, mask aligning, exposure, post-exposure baking, developing the photoresist, rinsing and drying. The etching process may be a dry etching process or a wet etching process. In some embodiments, a portion of the first ILD structure 114 and the second ILD structure 116 between the source/drain epitaxial structures 112 are removed and the opening 122 is formed.

Figure 1D:
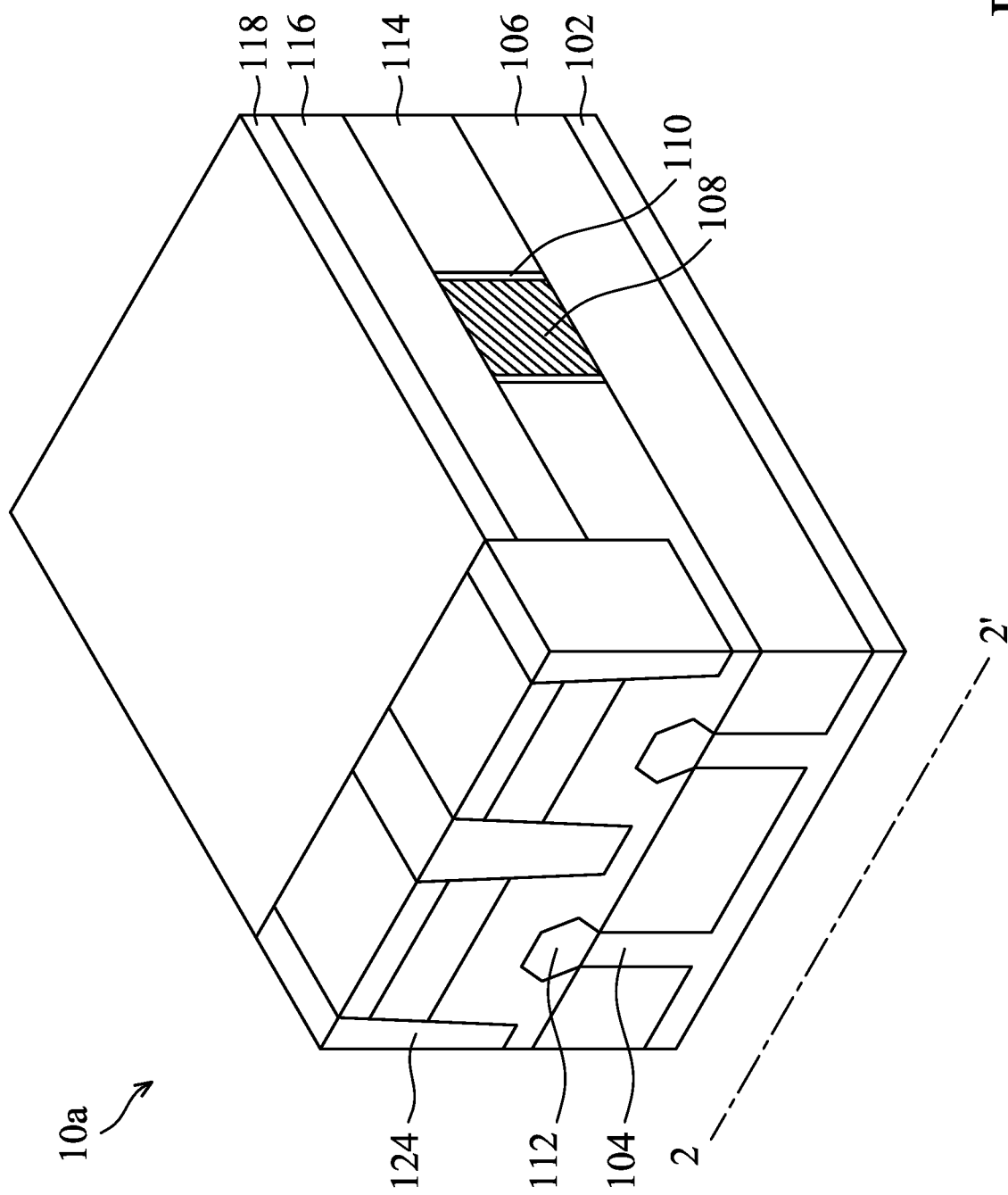
Figure 2D:
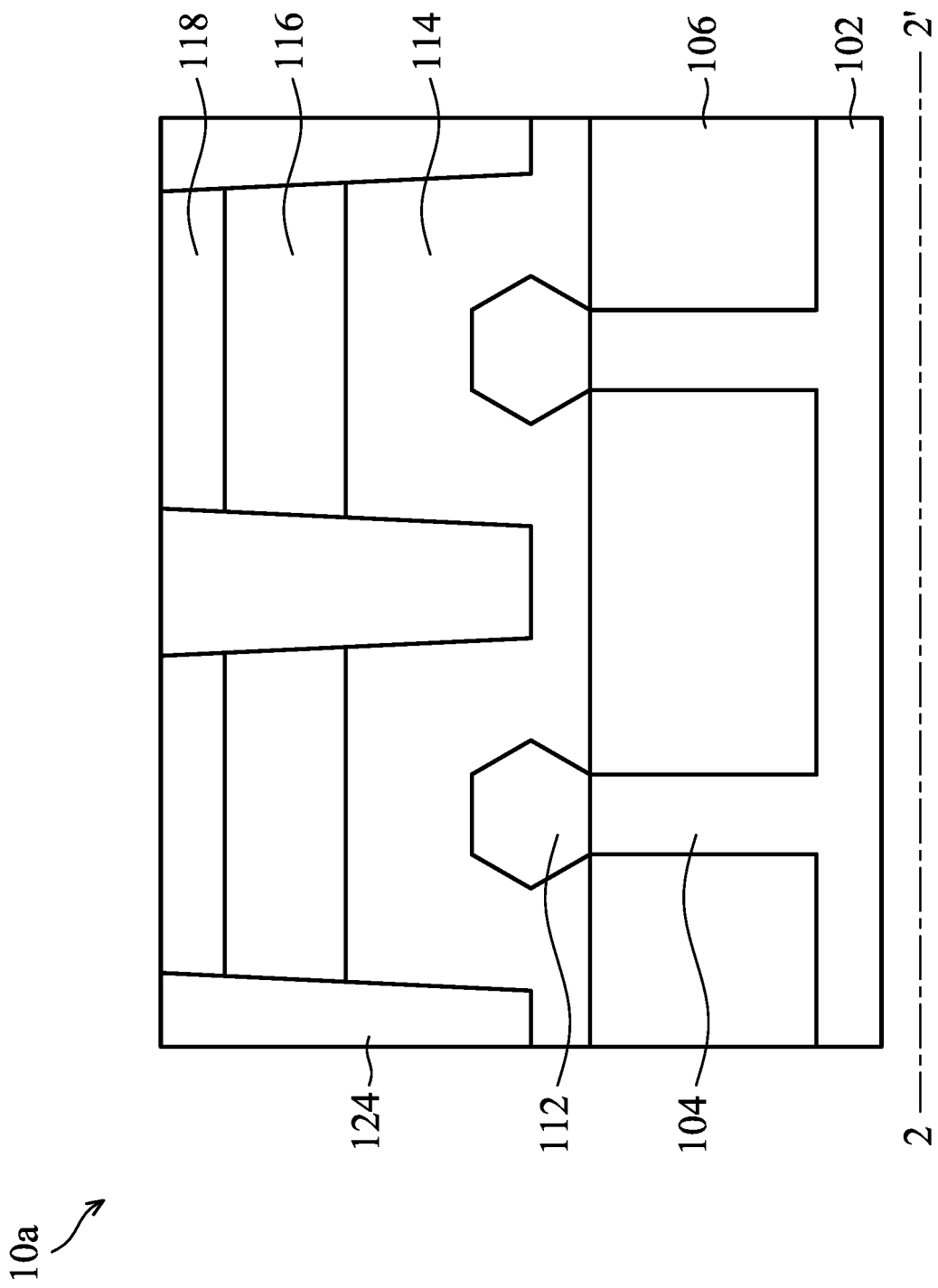

Next, a blocking material 124 is filled in the openings 122 over the first ILD structure 114 between the source/drain epitaxial structures 112, as shown in FIGS. 1D and 2D in accordance with some embodiments. The blocking material 124 may include SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, or SiO. The blocking material 124 may be formed by deposition processes, such as a chemical vapor deposition (CVD) process, a high-density plasma chemical vapor deposition (HDPCVD) process, a spin-on process, a sputtering process, or another applicable process.

Afterwards, a planarizing process is performed on the blocking material 124 until the top surface of the hard mask layer 118 is exposed, and a blocking structure 124 is formed as shown in FIGS. 1D and 2D in accordance with some embodiments. After the planarizing process, the top surface of the blocking structure 124 may be substantially level with the top surfaces of the hard mask layer 118. The planarizing process may include a grinding process, a chemical mechanical polishing (CMP) process, an etching process, another applicable process, or a combination thereof.

Figure 1E:
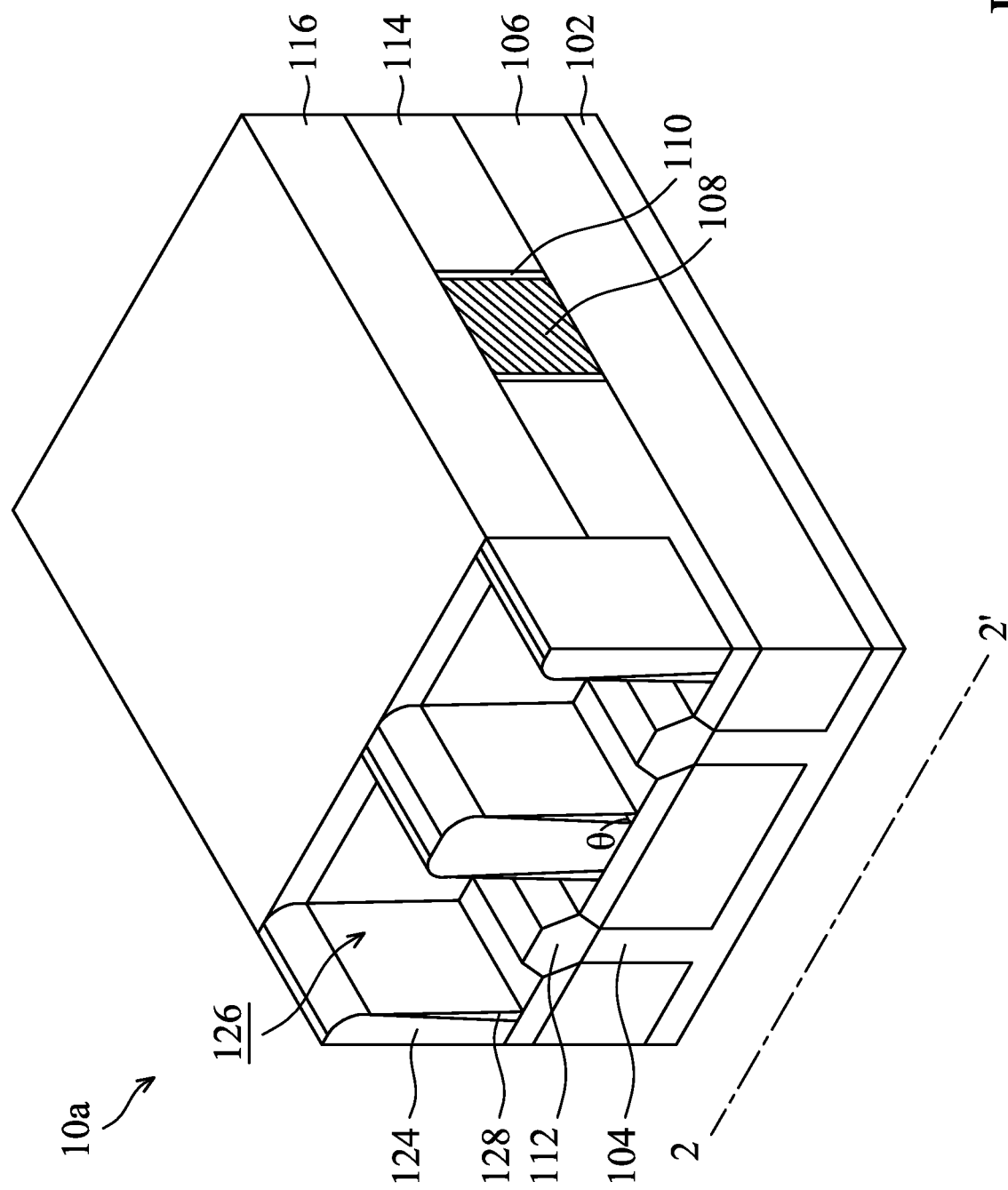
Figure 2E:
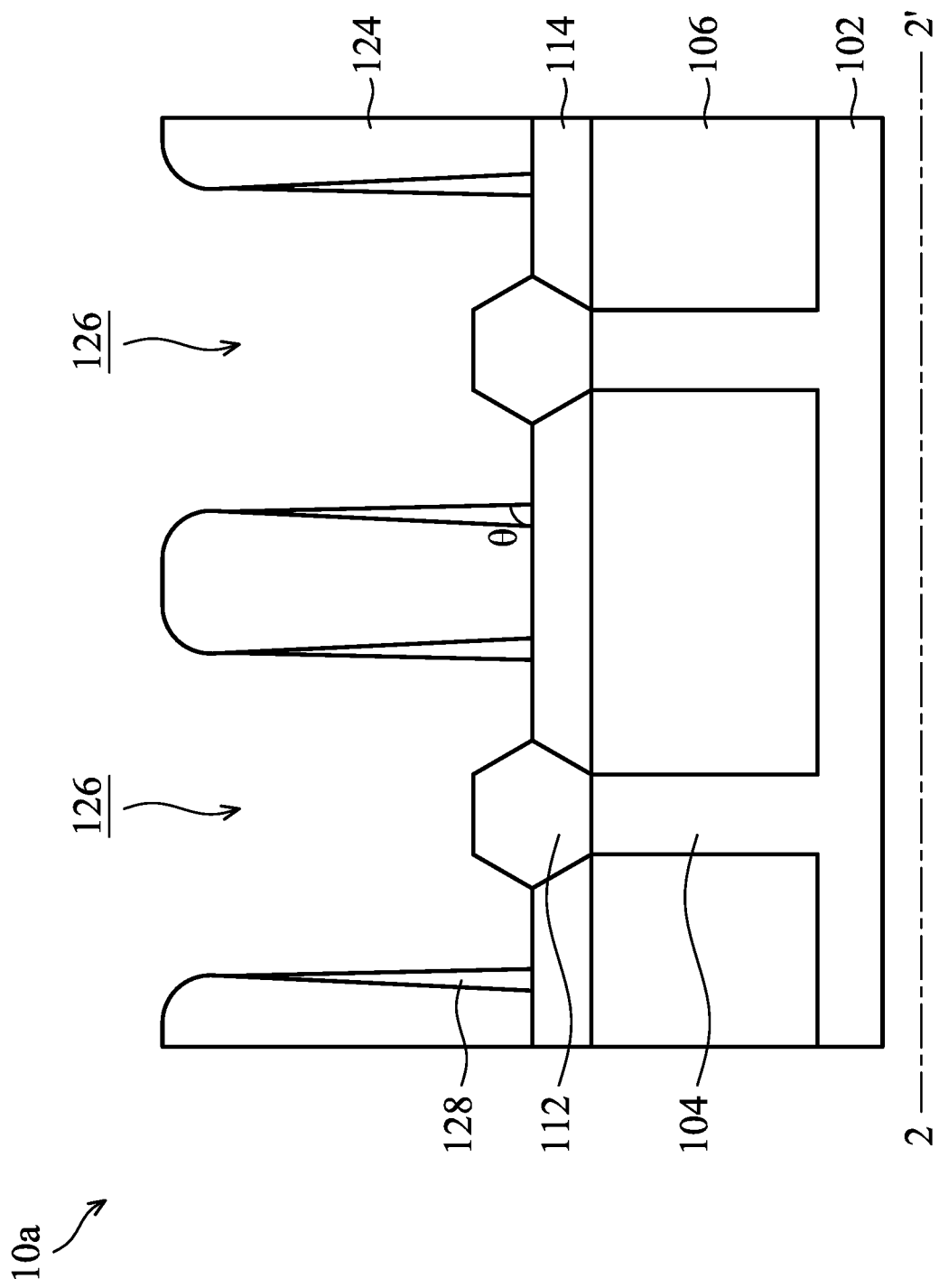

Next, the first ILD structure 114 and the second ILD structure 116 over the source/drain epitaxial structure 112 are removed, and a trench 126 is formed over the source/drain epitaxial structure 112, as shown in FIGS. 1E and 2E in accordance with some embodiments. In some embodiments, the blocking structure 124 between the source/drain epitaxial structures 112 is thick enough and is not easy to be etched during process of removing the first ILD structure 114 and the second ILD structure 116. Therefore, this may improve the isolation between subsequently formed contact structures. The trench 126 may be formed by an etching process such as a dry etching process or a wet etching process.

In some embodiments, a portion of the first ILD structure 114 and the second ILD structure 116 are left and a dielectric layer 128 is formed over the sidewalls of the blocking structure 124, as shown in FIGS. 1E and 2E in accordance with some embodiments. As shown in FIGS. 1E and 2E, an angle θ between a sidewall and a bottom surface of the dielectric layer 128 is in a range from about 70° to about 89°. If the angle θ is too great, it may be difficult to form contact structure in the trench 126 in the subsequent process. If the angle θ is too less, it may increase the resistance of contact structure subsequently formed in the trench 126.

Figure 1F:
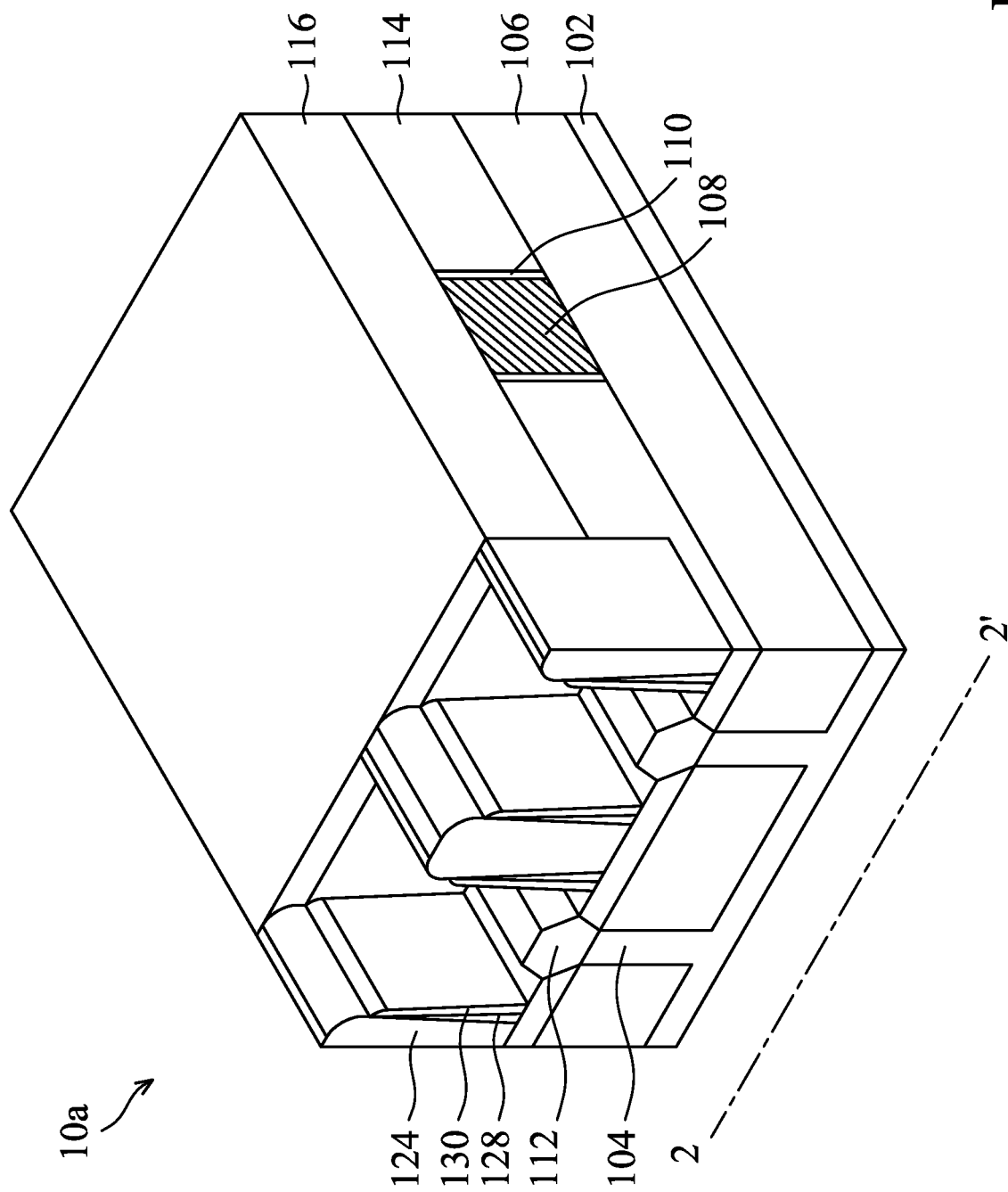
Figure 2F:
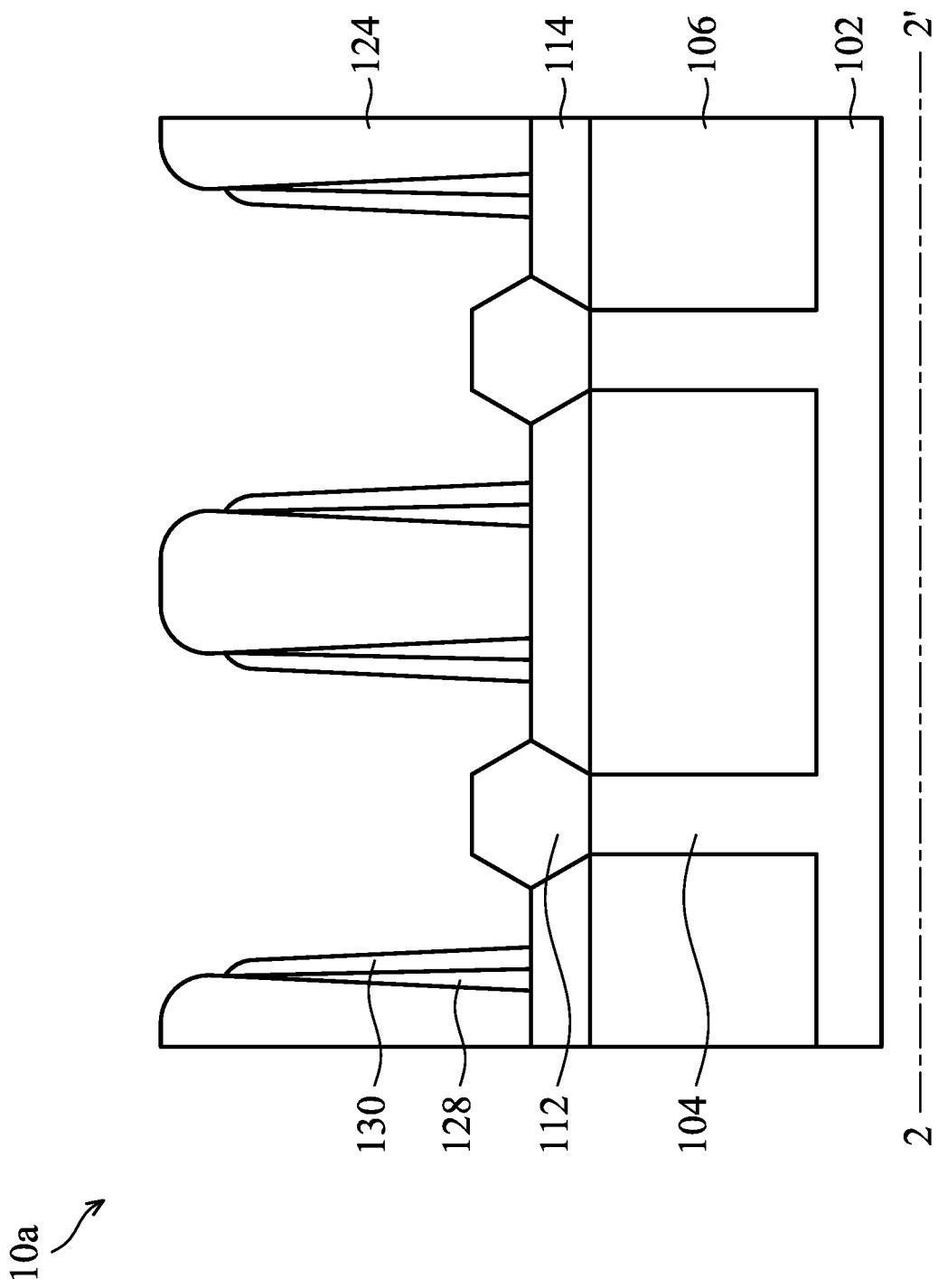

Next, a liner layer 130 is optionally formed over the dielectric layer 128, and also over the sidewalls of the blocking structure 124, as shown in FIGS. 1F and 2F in accordance with some embodiments. A liner layer 130 may be conformally formed over the blocking structure 124 and the dielectric layer 128 first. Afterwards, an etching process may be performed and the liner layer 130 is only left over the sidewalls of the blocking structure 124. The liner layer 130 may provide isolation between the gate structure 108 and the subsequently formed contact structure.

The liner layer 130 may include SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, or SiO. In some embodiments, the liner layer 130 and the dielectric layer 128 are made of different materials, providing different etching selectivity in the subsequent process. In some embodiments, the thickness of the liner layer 130 is in a range from about 0.5 nm to 20 nm. If the liner layer 130 is too thick, it may be difficult to form a subsequently formed contact structure. If the liner layer 130 is too thin, the isolation between the gate structure 108 and the subsequently formed contact structure may not be enough.

Moreover, with the liner layer 130 and the dielectric layer 128 formed over the sidewalls of the blocking structure 124, the subsequently formed contact structure over the source/drain epitaxial structure 112 may have downwardly tapered trapezoid shapes in a cross-sectional view. In this way, it may be easier to form the subsequently formed contact structure.

Next, a metal semiconductor compound layer may be formed over the source/drain epitaxial structure 112 (not shown). The metal semiconductor compound layer may reduce the contact resistance between the source/drain epitaxial structure 112 and the subsequently formed contact structure over the source/drain epitaxial structure 112. The metal semiconductor compound layer may be made of titanium silicide ($TiSi_2$), nickel silicide (NiSi), cobalt silicide (CoSi), or other suitable low-resistance materials. The semiconductor compound layer may be formed on the source/drain epitaxial structure 112 by forming a metal layer over the source/drain epitaxial structure 112 first. The metal layer may react with the source/drain epitaxial structure 112 by an annealing process and the semiconductor compound layer may be produced. Afterwards, the unreacted metal layer may be removed by an etching process and the metal semiconductor compound layer may be left.

Figure 1G:
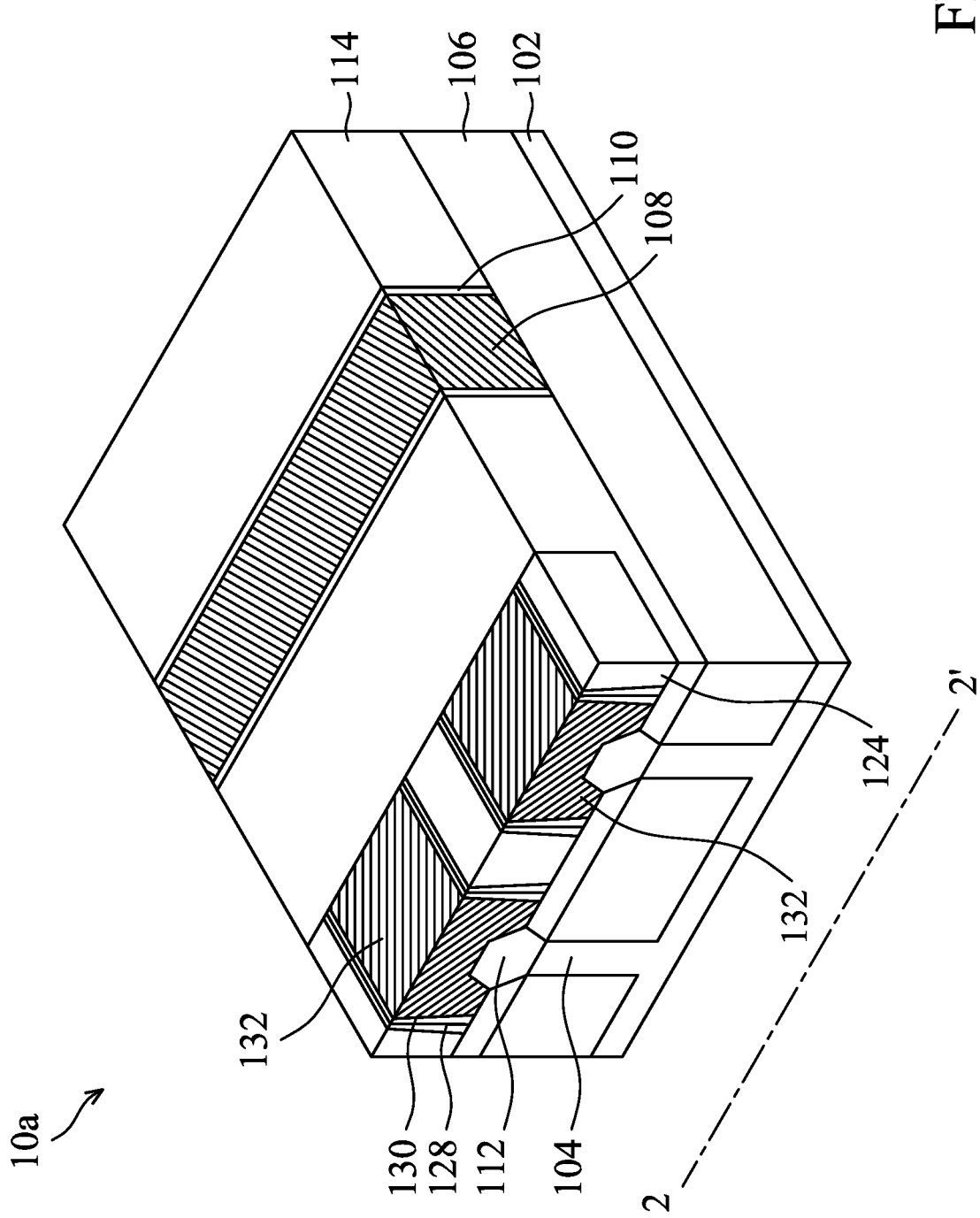
Figure 2G:
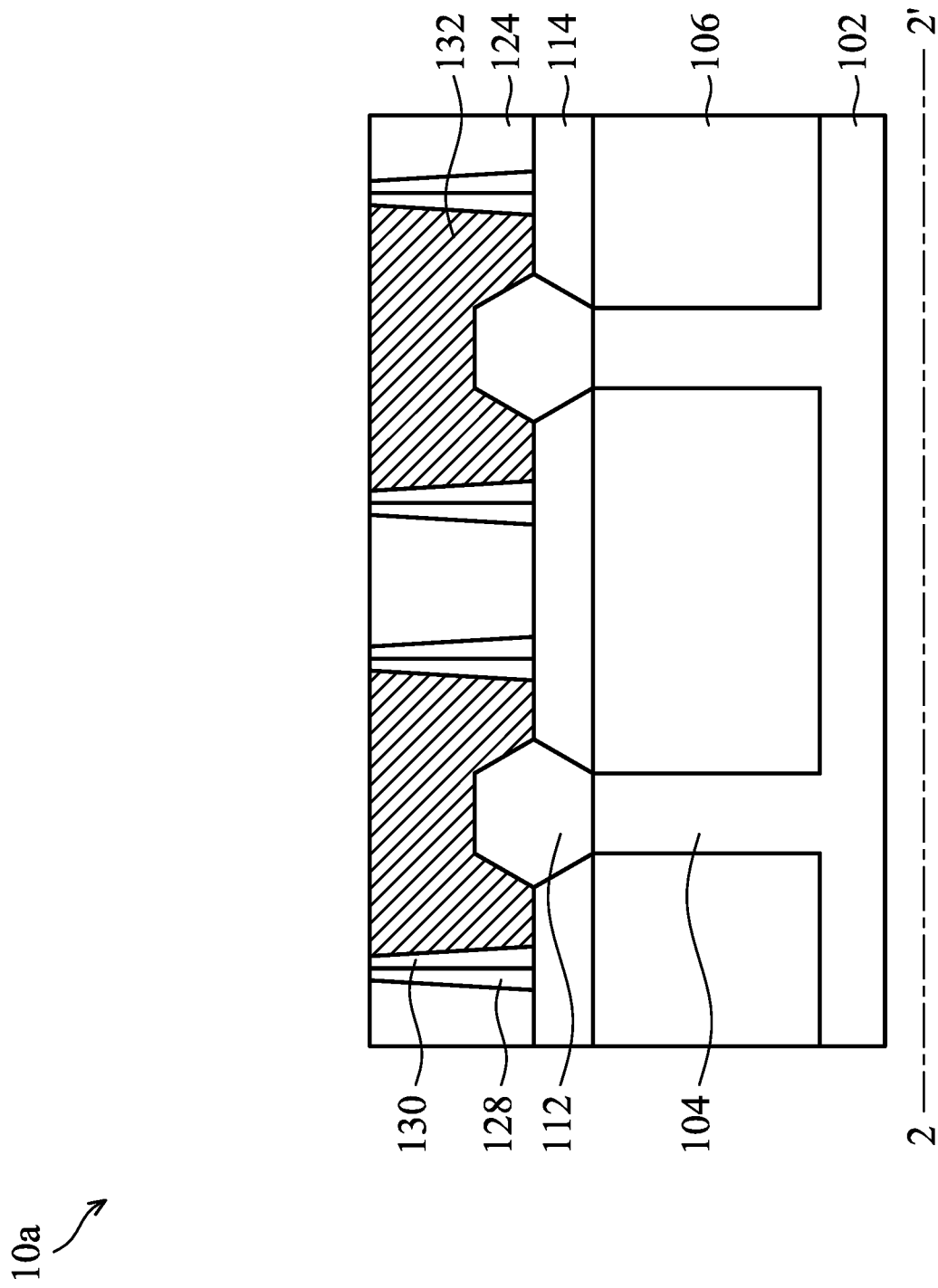

Afterwards, a contact structure 132 is filled into the trench 126 over the fin structure 104, as shown in FIGS. 1G and 2G in accordance with some embodiments. The contact structure 132 may be made of metal materials (e.g., W, Al, or Cu), metal alloys, poly-Si, other applicable conductive materials, or a combination thereof. The contact structure 132 may be formed by a chemical vapor deposition process (CVD), a physical vapor deposition process (PVD, e.g., evaporation or sputter), an atomic layer deposition process (ALD), an electroplating process, other suitable processes, or a combination thereof to deposit the conductive materials of the contact structure 132, and then optionally perform a chemical mechanical polishing (CMP) process or an etch back process to remove excess conductive materials.

Figure 1H:
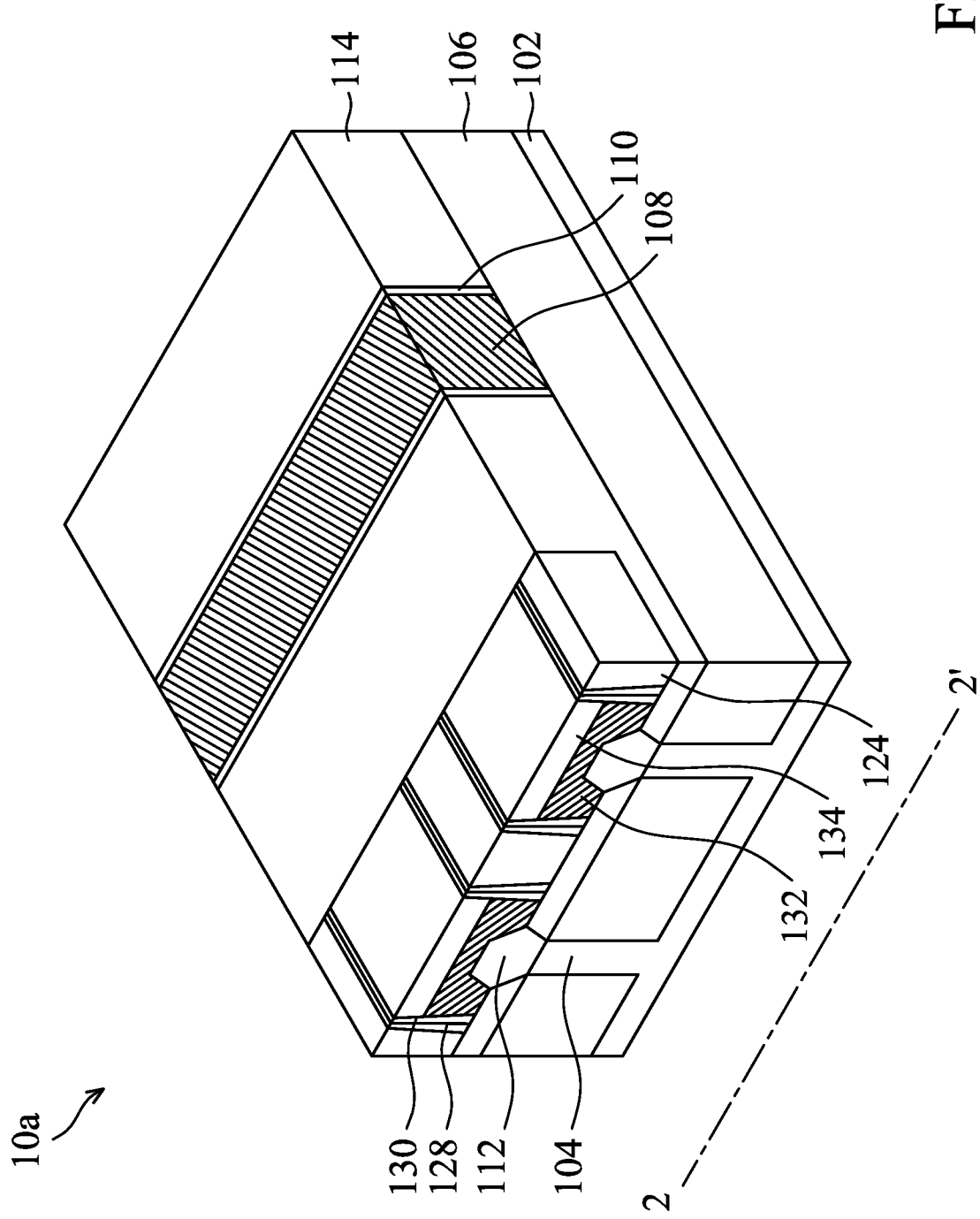
Figure 2H:
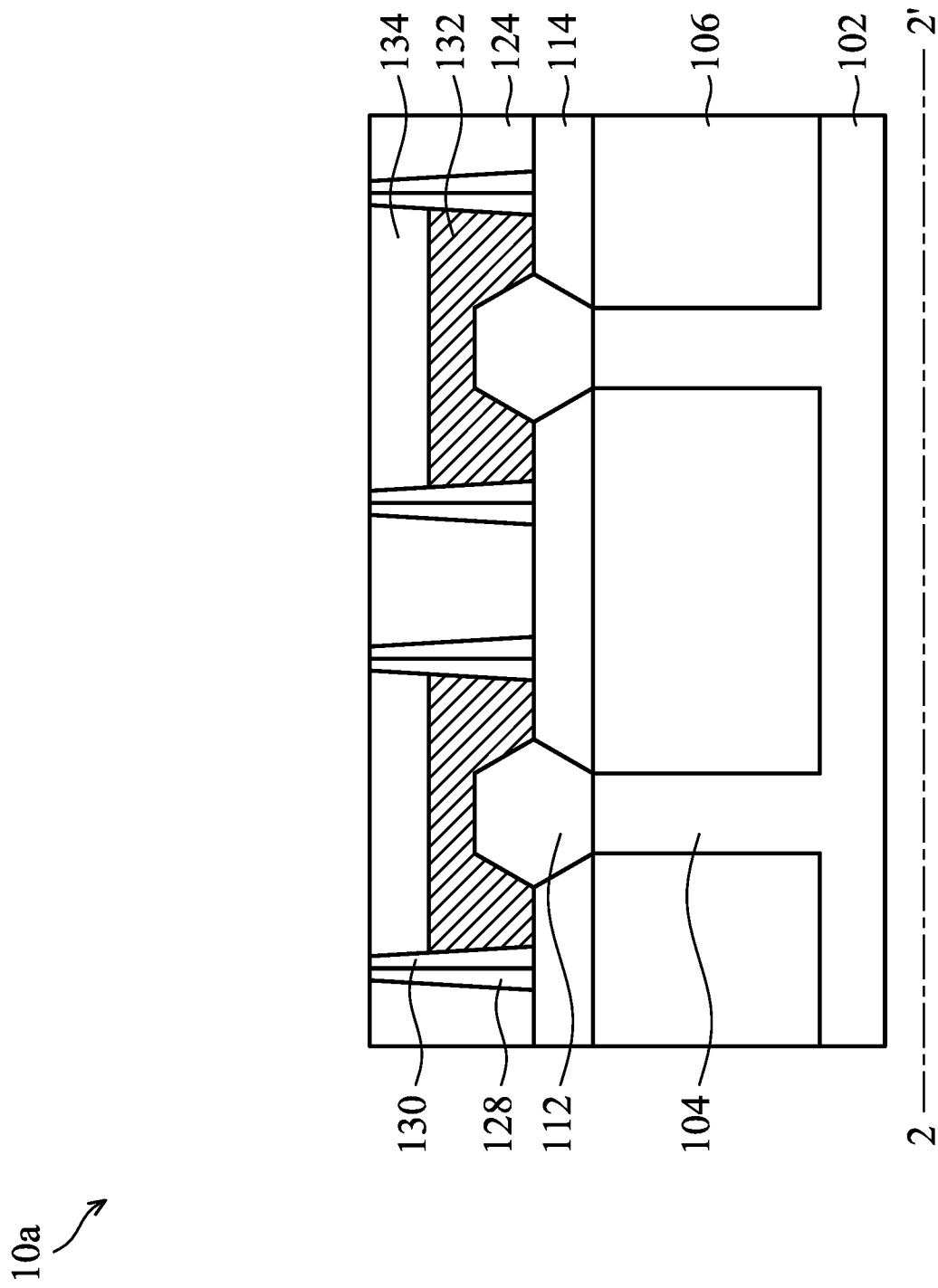

Next, the top portion of the contact structure 132 is optionally removed to form a recess and a cap layer 134 is optionally formed in the recess over the contact structure 132, as shown in FIGS. 1H and 2H in accordance with some embodiments. The cap layer 134 may include dielectric materials such as SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, or SiO. In some embodiments, the cap layer 134 and the dielectric layer 128 are made of different materials, providing different etching selectivity in the subsequent process. In some embodiments, the cap layer 134 and the blocking structure 124 are made of the same material. The cap layer 134 may be formed over the contact structure 132 by low-pressure chemical vapor deposition (LPCVD) or plasma enhanced chemical vapor deposition (PECVD), other suitable deposition processes, or a combination thereof. After the cap layer 134 is deposited, a planarization process (e.g., a chemical mechanical polishing process or an etching back process) may optionally be performed to remove excess dielectric materials.

The cap layer 134 may provide better isolation between the gate structure 108 and the contact structure 132. In some embodiments, the thickness of the cap layer 134 is in a range from about 1 nm to 100 nm. If the cap layer 134 is too thick, the capacitance may be increased. If the cap layer 134 is too thin, the isolation between the gate structure 108 and the contact structure 132 may not be enough.

Figure 1I:
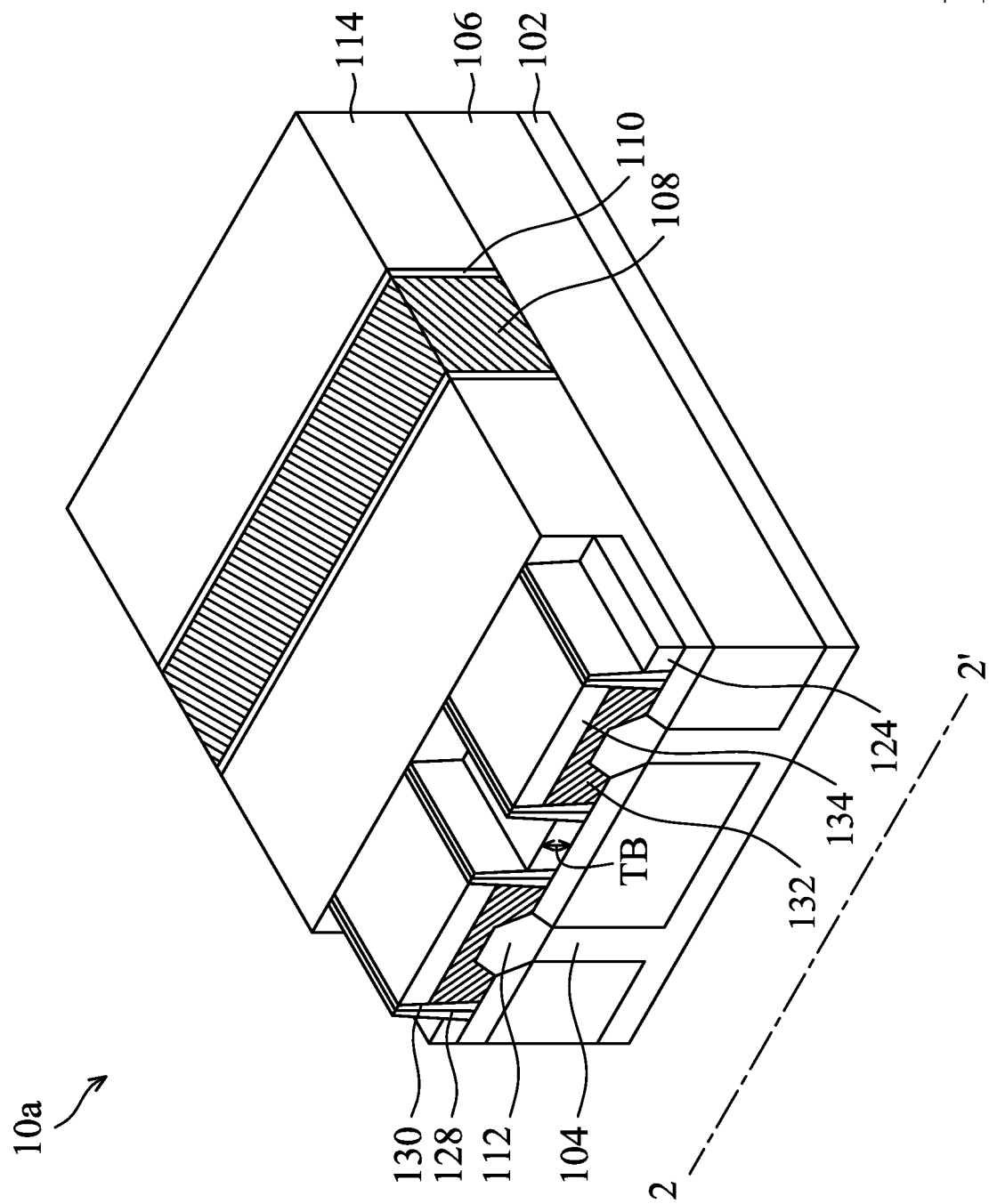
Figure 2I:
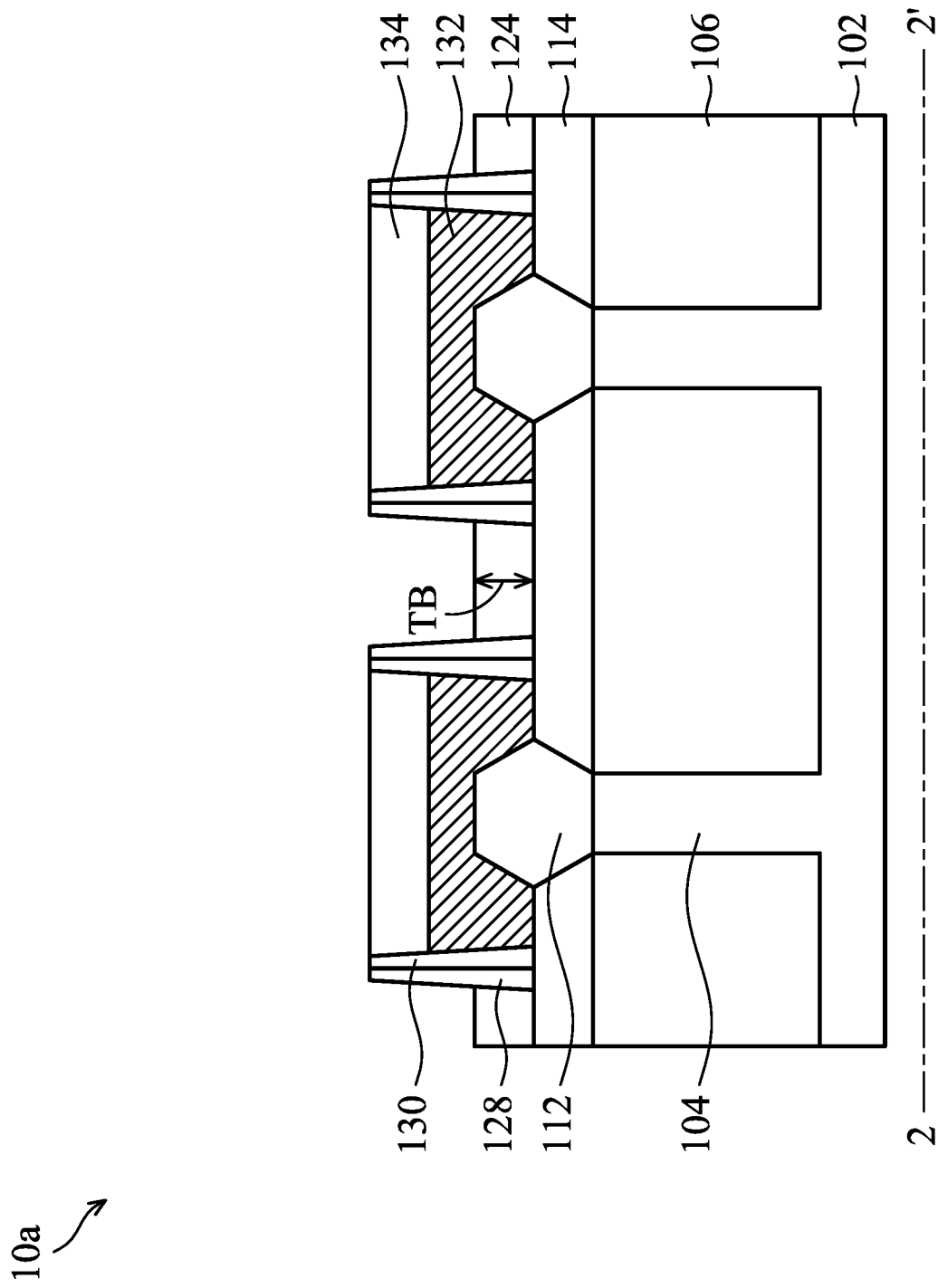

Next, a top portion of the blocking structure 124 between the contact structures 132 is removed, as shown in FIGS. 1I and 2I in accordance with some embodiments. The top portion of the blocking structure 124 is recessed by an etching process such as a dry etching process or a wet etching process. In some embodiments, after the etching process, the thickness TB of the blocking structure 124 is in a range from about 1 nm to 100 nm. If the blocking structure 124 structure is too thick, the capacitance between the contact structures 132 may be increased. If the blocking structure 124 structure is too thin, the structures beneath the blocking structure 124 may not be well protected. Moreover, with only the cap layer 134 covering the contact structures 132, it may be easier to recess the top portion of the blocking structure 124.

Figure 1J:
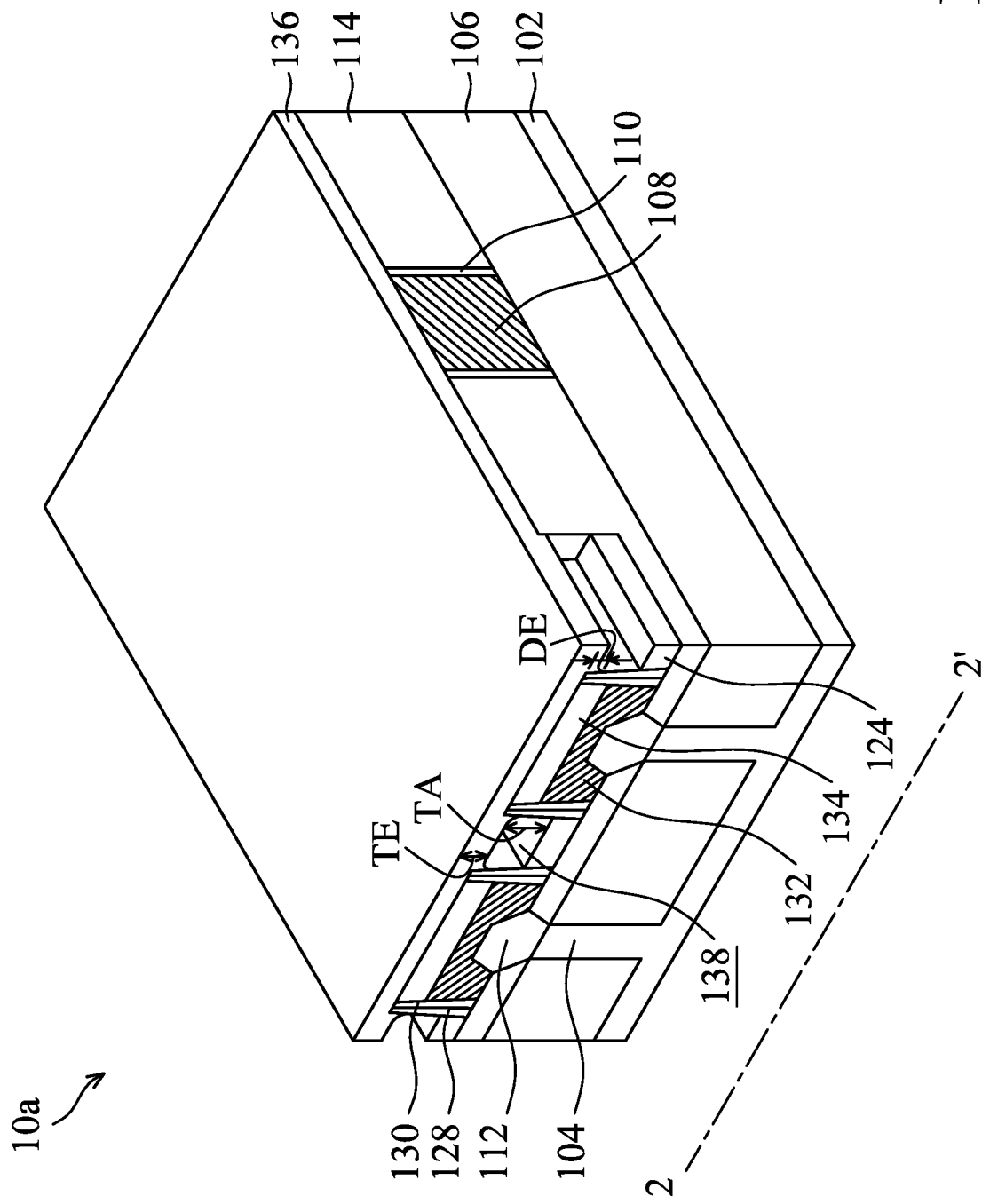
Figure 2J:
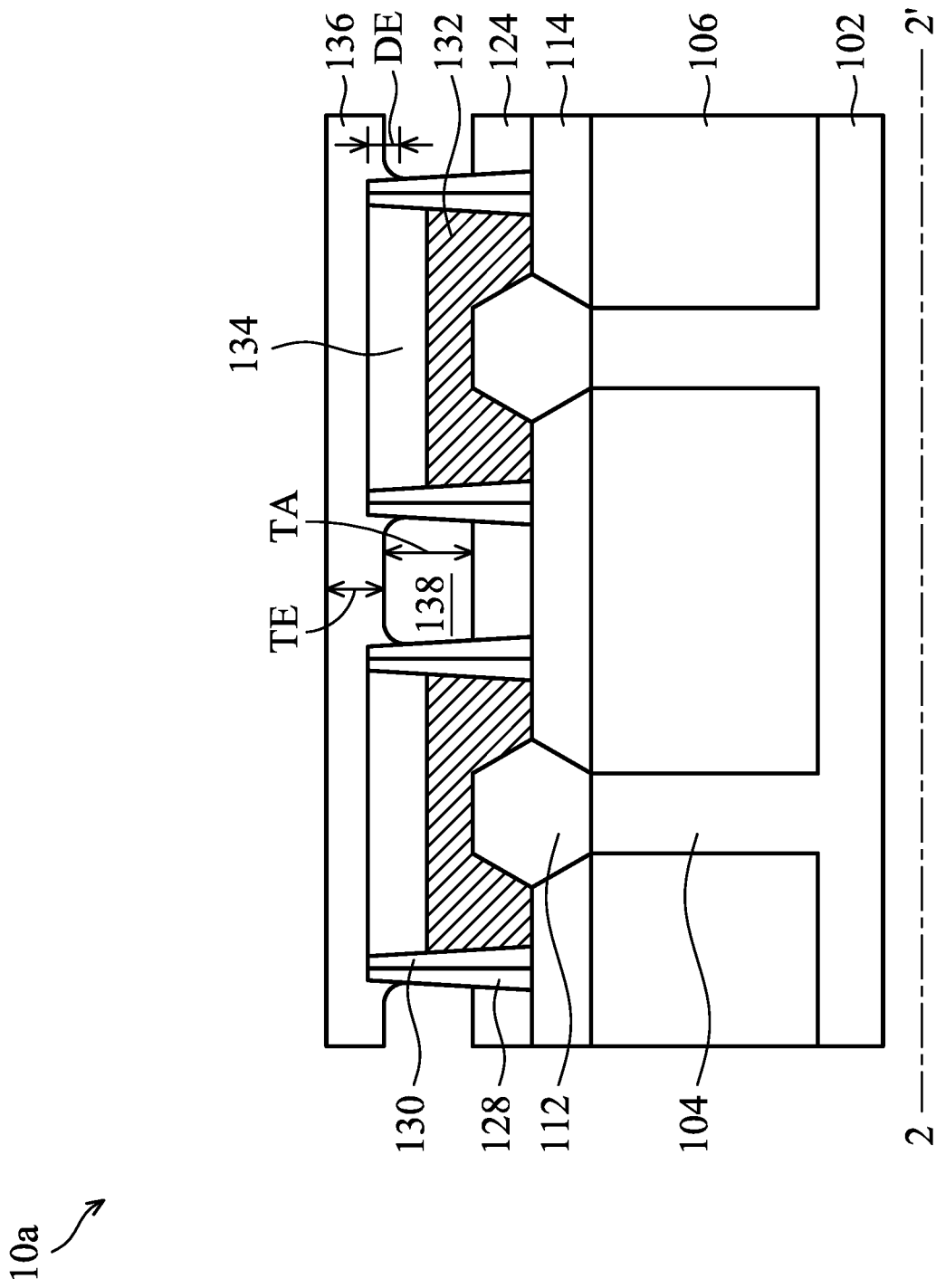

Afterwards, an etch stop layer 136 is deposited over the blocking structure 124 and the contact structures 132, and an air gap 138 is formed between the etch stop layer 136 and the blocking structure 124, as shown in FIGS. 1J and 2J in accordance with some embodiments. In some embodiments, the air gap 138 is formed above the blocking structure 124 and below the etch stop layer 136. In some embodiments, the air gap 138 is formed between the contact structures 132. In some embodiments, the air gap 138 is surrounded by the first ILD structure 114. The air gap 138 may lower the capacitance between the neighboring contact structures 132 or lower the capacitance between the contact structure 132 and the subsequently formed via structure. The air gap 138 may also block leakage path between the contact structures 132, and therefore the reliability may be improved.

The etch stop layer 136 may include dielectric materials such as SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, or SiO. In some embodiments, the etch stop layer 136 may be made of SiN, SiO, SiOCN, SiOC, HfO, AlO, AlON, SiCN. The etch stop layer 136 may be deposited by CVD processes such as atmospheric pressure CVD (APCVD), low-pressure CVD (LPCVD), and plasma-enhanced CVD (PECVD). In some embodiments, the etch stop layer 136 is made of the same material with the blocking structure 124 or the capping layer 130.

In some embodiment, the etch stop layer 136 is deposited with poor gap fill capability, such that the air gap 138 may be easily formed between the etch stop layer 136 and the blocking structure 124. The etch stop layer 136 may be deposited at a temperature in a range from about 100° C. to about 500° C. If the temperature is too high, it may not be easy to form the air gap 138 between the etch stop layer 136 and the blocking structure 124. If the temperature is too low, the quality of the etch stop layer 136 may be worse. The etch stop layer 136 may be deposited at a deposition rate in a range from about 5 minutes to 180 minutes per wafer. If the deposition rate is too slow, it may not be easy to form the air gap 138 between the etch stop layer 136 and the blocking structure 124. If the deposition rate is too fast, the quality of the etch stop layer 136 may be worse.

In some embodiments, the thickness TA of the air gap 138 is in a range from about 0.5 nm to 100 nm. If the air gap 138 is too thick, the structure underneath may not be well protected, and it may collapse. If the air gap 138 is too thin, the capacitance between the contact structures 132 may be increased. In some embodiments, the thickness TE of the etch stop layer 136 is in a range from about 1 nm to 100 nm. If the etch stop layer 136 is too thick or too thin, it may not be easy to form a subsequently formed via structure.

In some embodiments, the etch stop layer 136 has a downwardly concave shape bottom surface between the contact structures 132 in a cross-sectional view, as shown in FIGS. 1J and 2J in accordance with some embodiments. In some embodiments, the extending depth DE of the etch stop layer 136 at the sidewalls of the blocking structures 124 is in a range from about 0.5 nm to 20 nm. If the extending depth DE of the etch stop layer 136 is too deep, the air gap 138 may be too small, and the capacitance between the contact structures 132 may be increased. In some embodiments, the etch stop layer 136 does not extend at the sidewalls of the blocking structures 124. Therefore, the bottom surface of the etch stop layer 136 is aligned with the top surface of the cap layer 134.

Figure 1K:
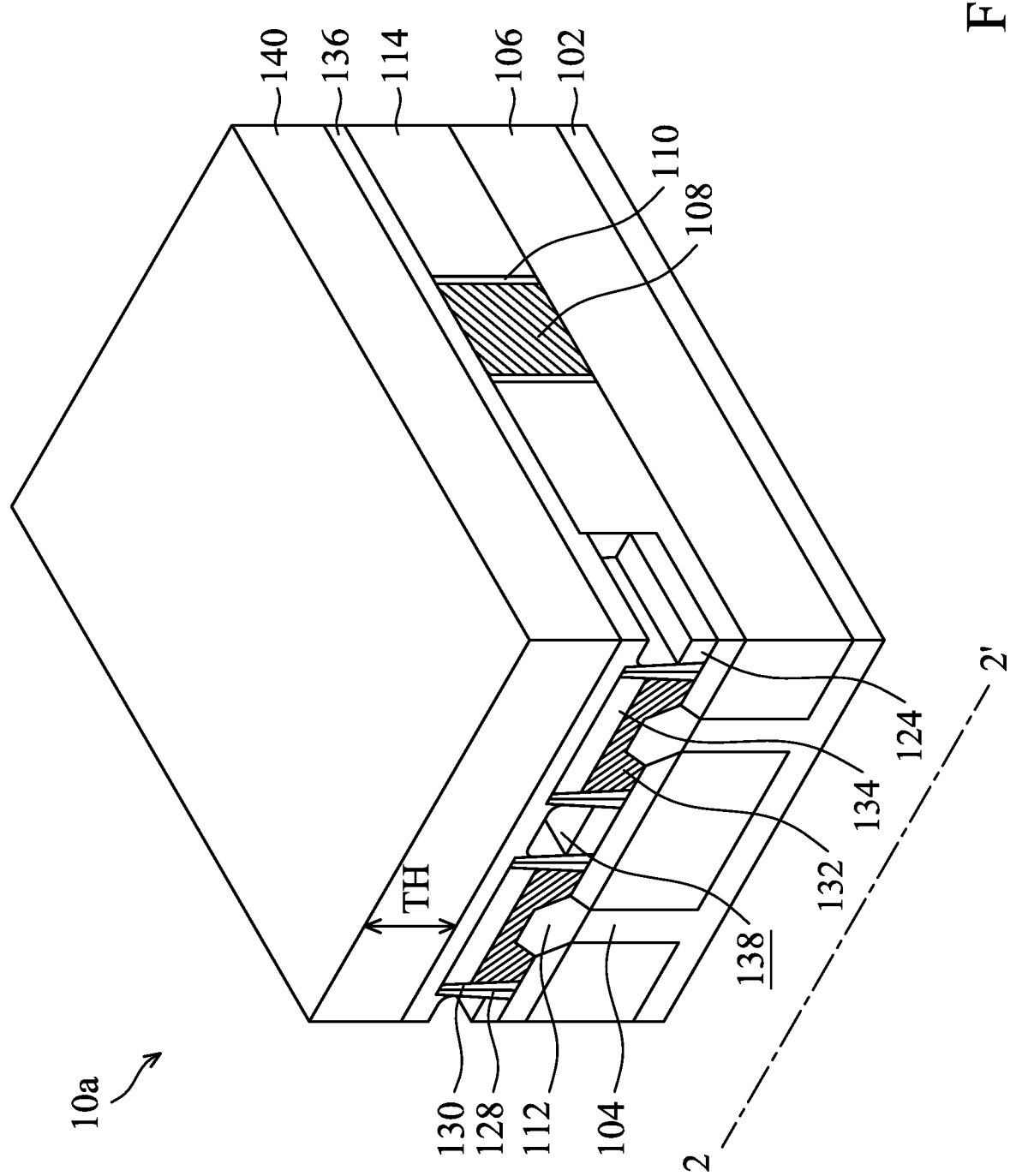
Figure 2K:
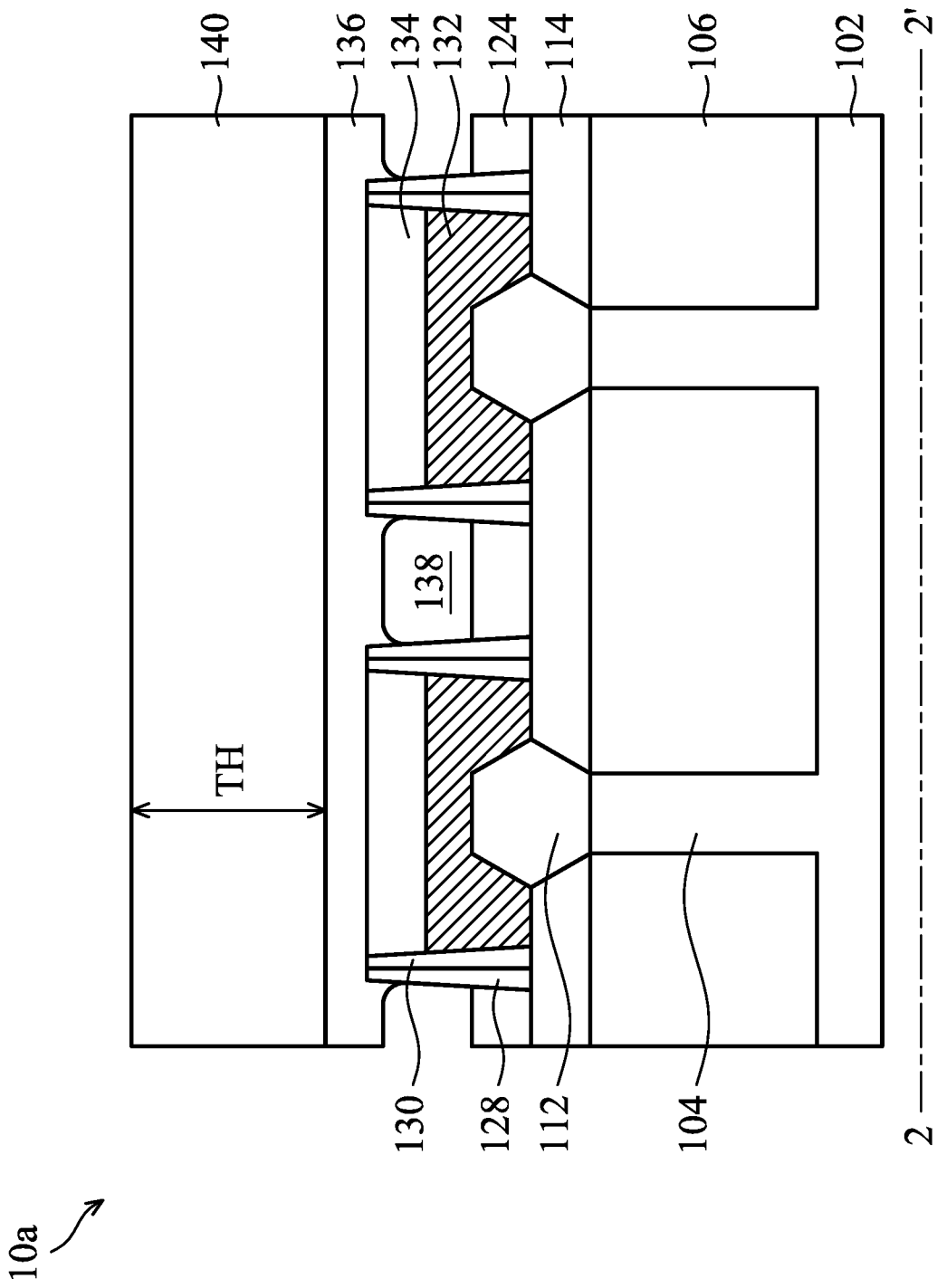

Next, a hard mask layer 140 is formed over the etch stop layer 136, as shown in FIGS. 1K and 2K in accordance with some embodiments. The etch stop layer 136 and the hard mask layer 140 may provide a distance between the contact structures 132 and the subsequently formed metal layer.

The hard mask layer 140 may include dielectric materials such as SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, or SiO. In some embodiments, the etch stop layer 136 and the hard mask layer 140 are made of different materials, providing different etching selectivity in the subsequent process for forming the via structure. In some embodiments, the hard mask layer 140 is made of the same material with the blocking structure 124 or the capping layer 130. The hard mask layer 140 may be formed by deposition processes, such as a chemical vapor deposition (CVD) process, a high-density plasma chemical vapor deposition (HDPCVD) process, a spin-on process, a sputtering process, or another applicable process. In some embodiments, the thickness TH of the hard mask layer 140 is in a range from about 1 nm to 100 nm. If the hard mask layer 140 is too thick or too thin, it may not be easy to form a subsequently formed via structure.

Figure 1L:
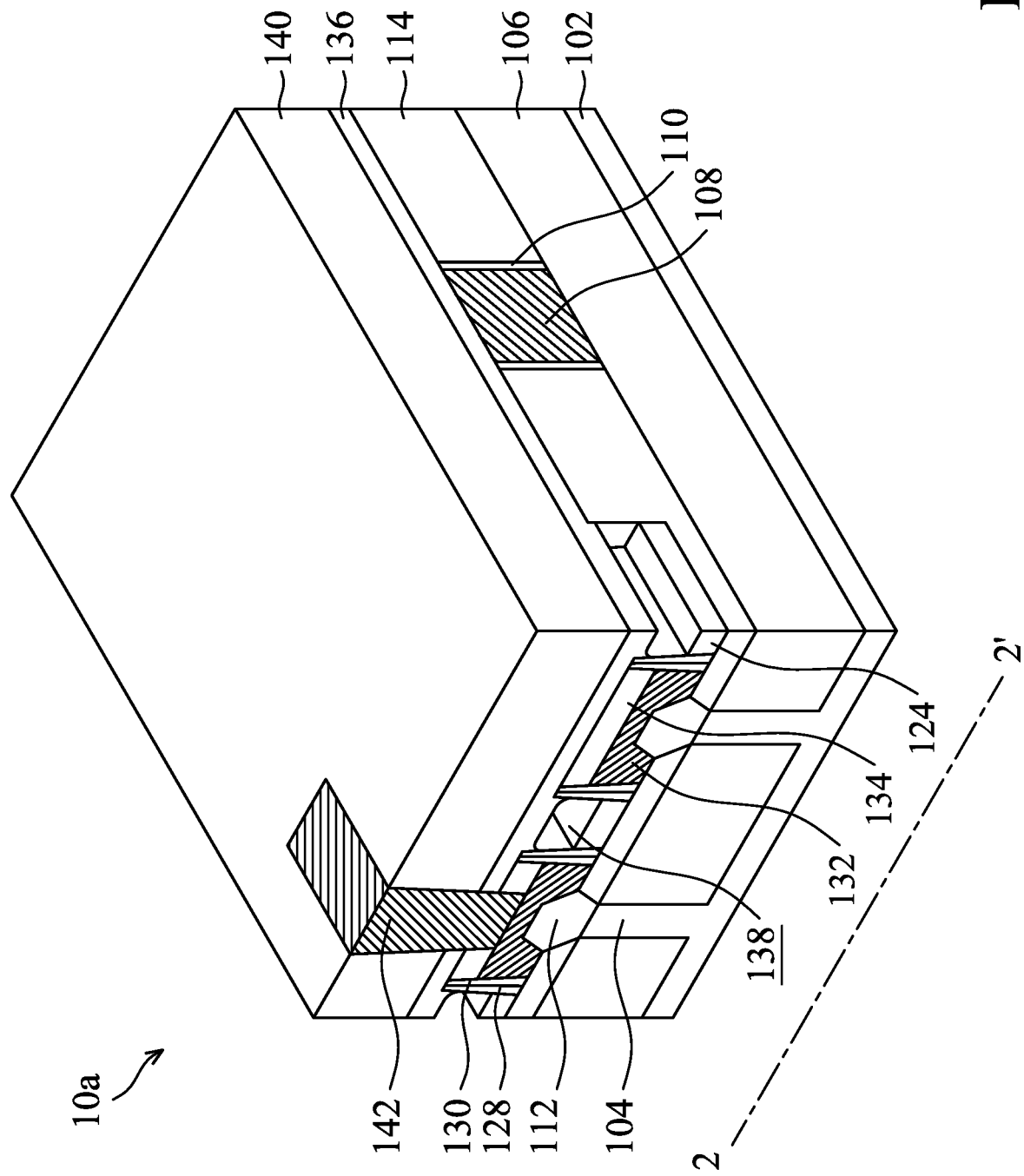
Figure 2L:
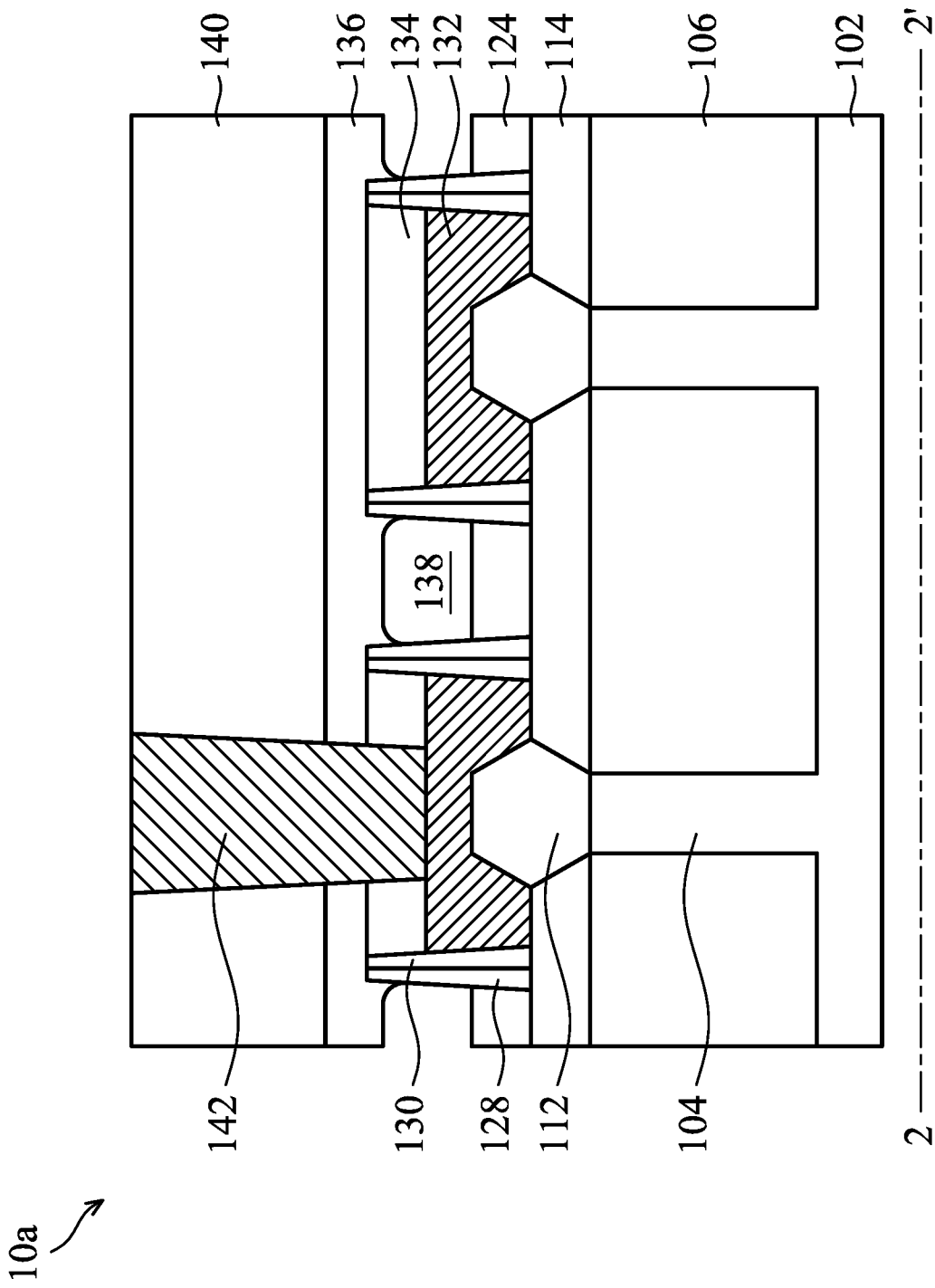

Afterwards, a via structure 142 is formed through the hard mask 140 and the etch stop layer 136 over one of the contact structure 132, as shown in FIGS. 1L and 2L in accordance with some embodiments. In some embodiments, the via structure 142 is in direct contact with and electrically connected to the contact structure 132.

An openings may be formed in the hard mask 140 and the etch stop layer 136 (not shown) by a lithography process (e.g., coating the resist, soft baking, exposure, post-exposure baking, developing, other applicable processes, or a combination thereof), an etching process (e.g., wet etching process, dry etching process, other applicable processes, or a combination thereof), other applicable processes, or a combination thereof. Then, the opening is filled with a conductive material to form the via structure 142. The conductive material may include metals (e.g., W, Al, or Cu), metal alloys, poly-silicon, other applicable conductive materials, or a combination thereof. The via structure 142 may be formed by using a physical vapor deposition process (e.g., evaporation or sputtering), an atomic layer deposition process, an electroplating process, other applicable processes or a combination thereof to fill the opening with the conductive material. Furthermore, after depositing the conductive material, a chemical-mechanical polishing process or an etch-back process can be used to remove the excessive conductive material.

With an air gap 138 formed between the contact structures 132, the capacitance between the contact structures 132 and the capacitance between the via structure 142 and the contact structure 132 may be reduced. In addition, the leakage path between the contact structures 132 may also be blocked by the air gap 138, and reliability may be improved. Since the contact structures 132 are formed by using the blocking structures 124 as thicker mask layers, the isolation between the contact structures 132 may be improved.

Figure 3:
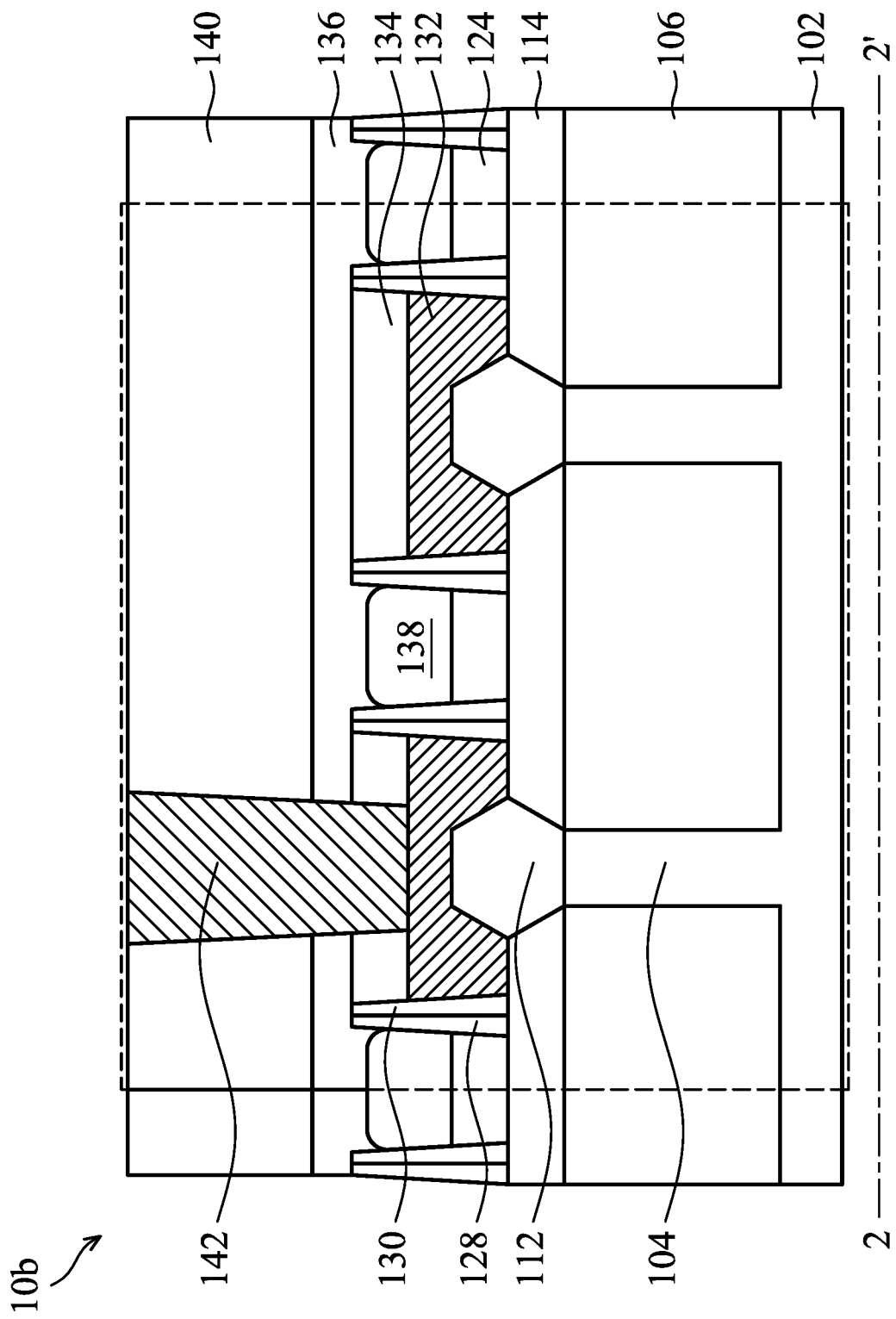
FIG. 3 is a cross-sectional representation of a modified FinFET device structure, in accordance with some embodiments of the disclosure.

Many variations and/or modifications may be made to the embodiments of the disclosure. FIG. 3 is a cross-sectional representation of a modified FinFET device structure 10*b*, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 3 in accordance with some embodiments, the air gap 138 and the blocking structure 124 at two sides of the contact structures 132 are complete air gap and blocking structure. In other words, the embodiments as shown in FIGS. 1A-1L and FIGS. 2A-2L are marked by a dashed box as shown in FIG. 3.

Many variations and/or modifications may be made to the embodiments of the disclosure. FIGS. 4A-4D are perspective representations of various stages of forming a modified FinFET device structure 10*c*, in accordance with some embodiments of the disclosure. Some processes or devices are the same as, or similar to, those described in the embodiments above, and therefore the descriptions of these processes and devices are not repeated herein. The difference from the embodiments described above is that, as shown in FIGS. 4A and 5A in accordance with some embodiments, before recessing the blocking structure 124, the etch stop layer 136 and the hard mask layer 140 are formed over the blocking structure 124 and the contact structures 132.

FIGS. 4A-4D are perspective representations of various stages of forming the FinFET device structure 10*c*, and FIGS. 5A-5D show cross-sectional representations taken along line 5-5' in FIGS. 4A-4D in accordance with some embodiments.

Figure 4A:
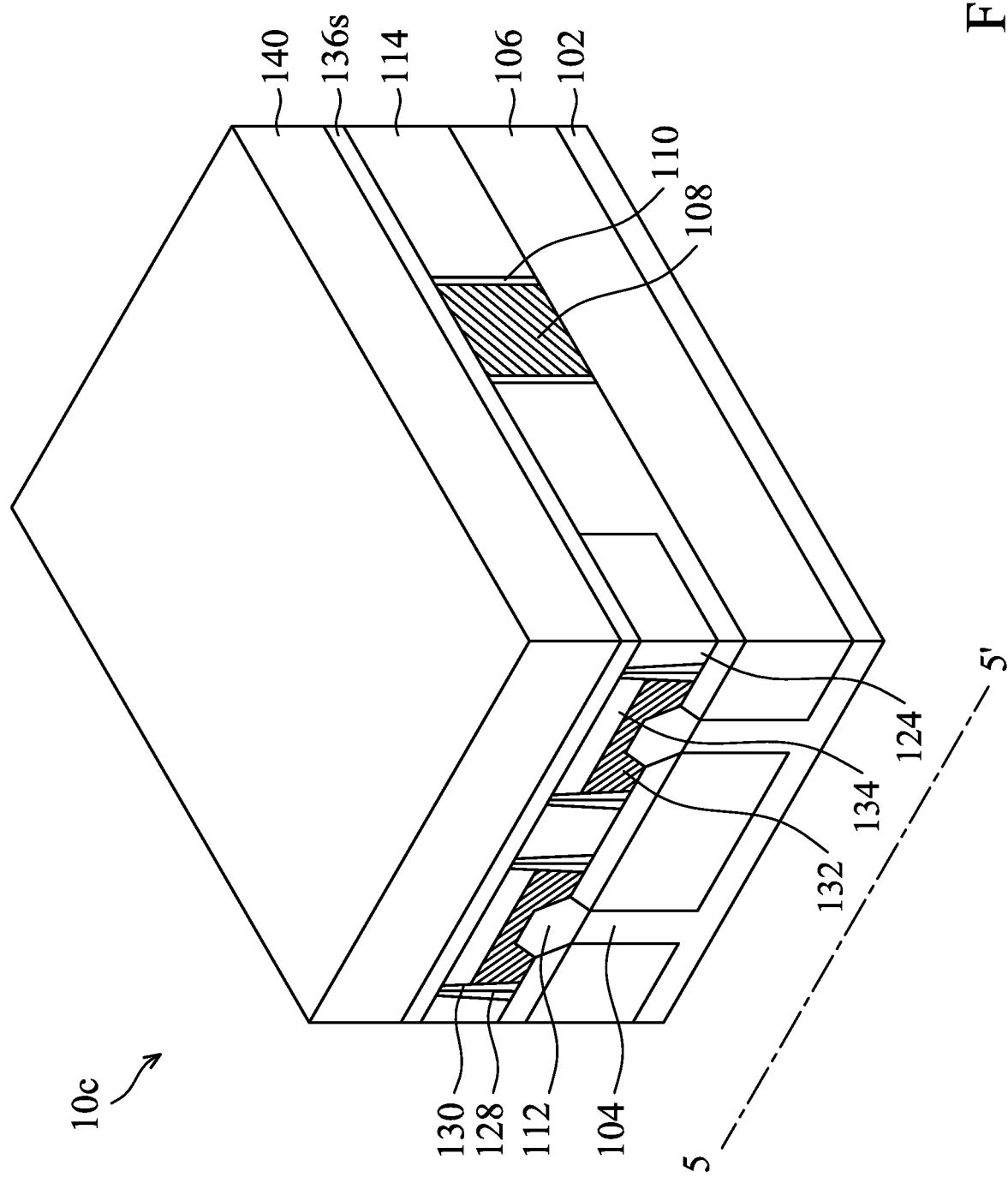
FIGS. 4A-4D are perspective representations of various stages of forming a modified FinFET device structure, in accordance with some embodiments of the disclosure.
Figure 5A:
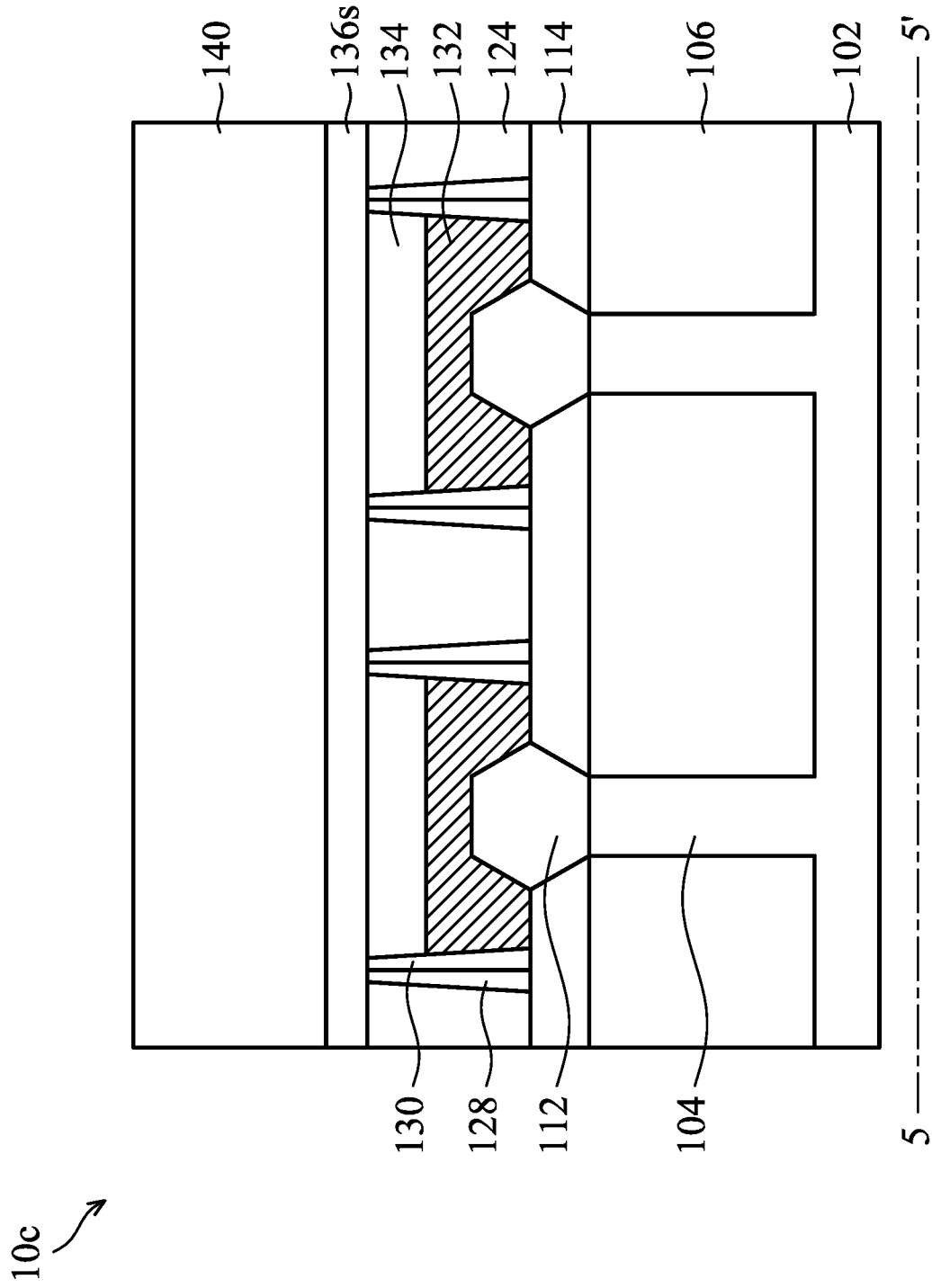
FIGS. 5A-5D are cross-sectional representations of various stages of forming a modified FinFET device structure shown in FIGS. 4A-4D, in accordance with some embodiments of the disclosure.

After the blocking layer 124 are deposited between the fin structures 112, a sacrificial etch stop layer 136*s* is formed over the blocking structure 124 and the contact structures 132, as shown in FIGS. 4A and 5A in accordance with some embodiments. Afterwards, a hard mask layer 140 is formed over the sacrificial etch stop layer 136*s*. In some embodiments, the sacrificial etch stop layer 136*s* and a hard mask layer 140 are made of different materials, providing different etching selectivity in the subsequent process forming the via structure. The processes of forming the sacrificial etch stop layer 136*s* and the hard mask layer 140 are the same as, or similar to, those used to form the etch stop layer 136 and the hard mask layer 140 described in the previous embodiments. For the purpose of brevity, the descriptions of these processes are not repeated herein.

Next, the via structure 142 is formed through the sacrificial etch stop layer 136*s* and the hard mask layer 140 and directly contacts one of the contact structures 132 (not shown). In this way, the via structure 142 is electrically connected to one of the contact structures 132.

Figure 4B:
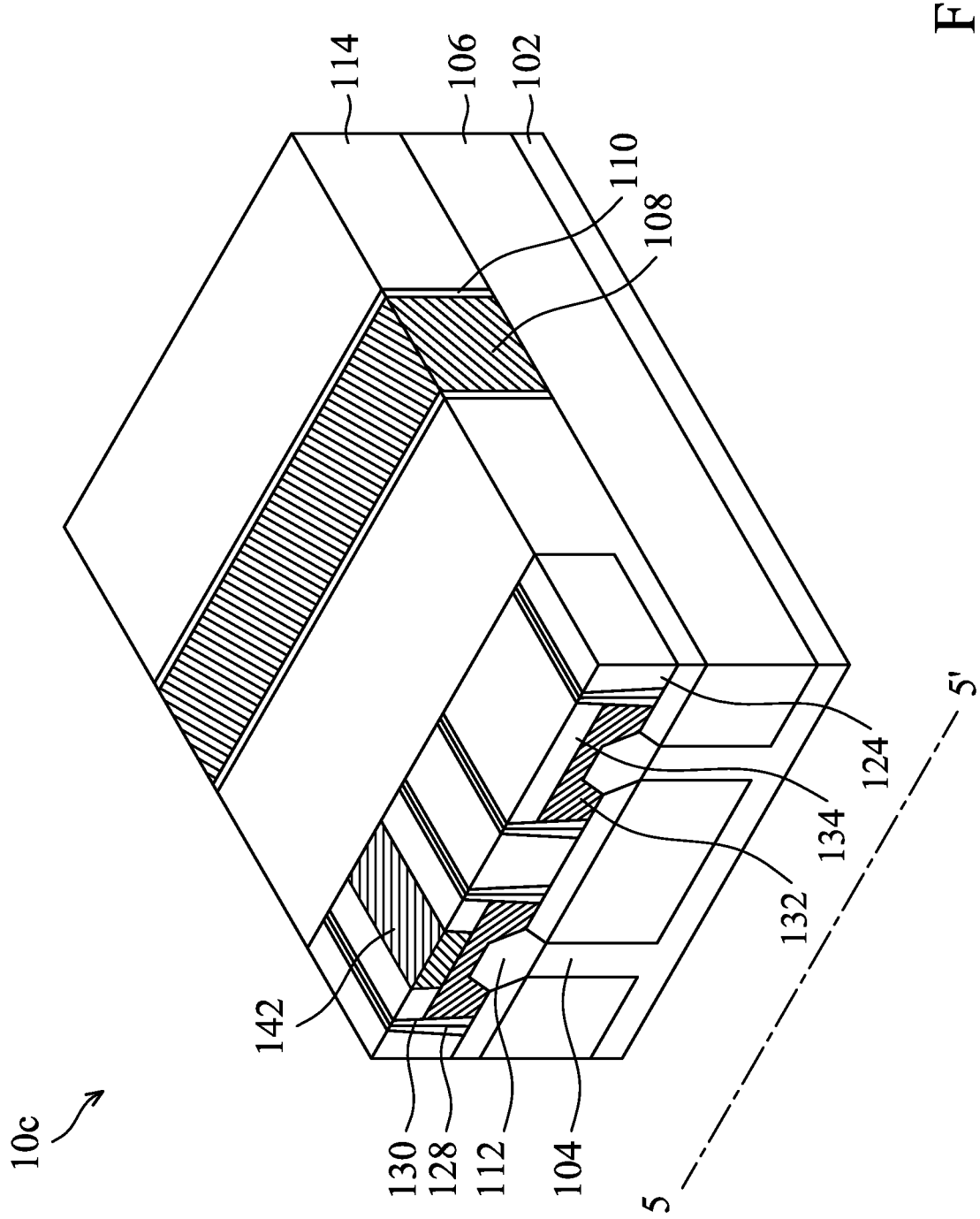
Figure 5B:
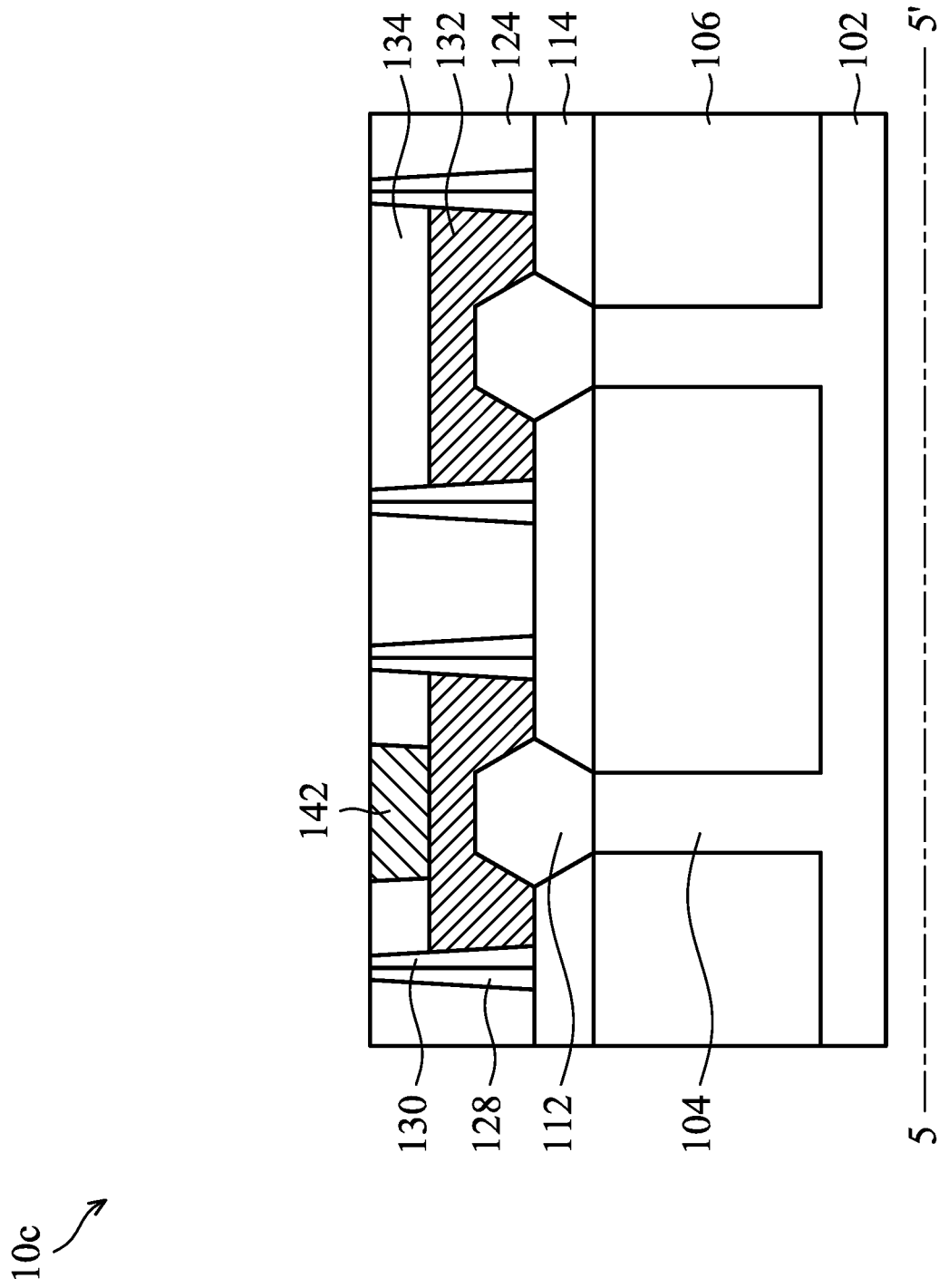

Afterwards, a planarizing process is performed on the hard mask layer 140, the sacrificial etch stop layer 136*s*, and the via structure 142 until the top surface of the blocking layer 124 is exposed, as shown in FIGS. 4B and 5B in accordance with some embodiments. In some embodiments, the hard mask layer 140 and the sacrificial etch stop layer 136*s* are removed. After the planarizing process, the top surface of the via structure 142 may be substantially level with the top surfaces of the blocking layer 124. In some embodiments, the planarizing process includes a grinding process, a chemical mechanical polishing (CMP) process, an etching process, another applicable process, or a combination thereof.

Figure 4C:
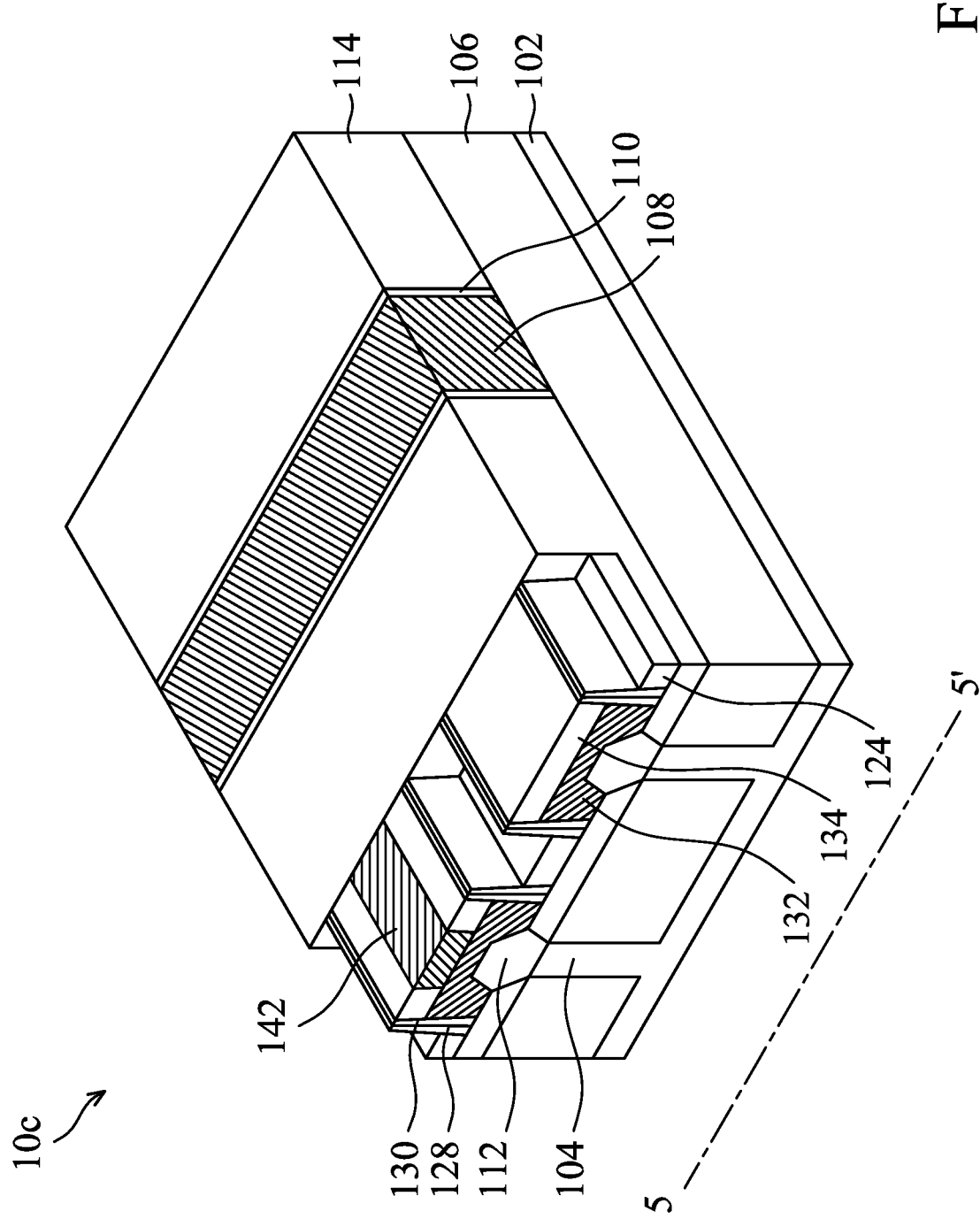
Figure 5C:
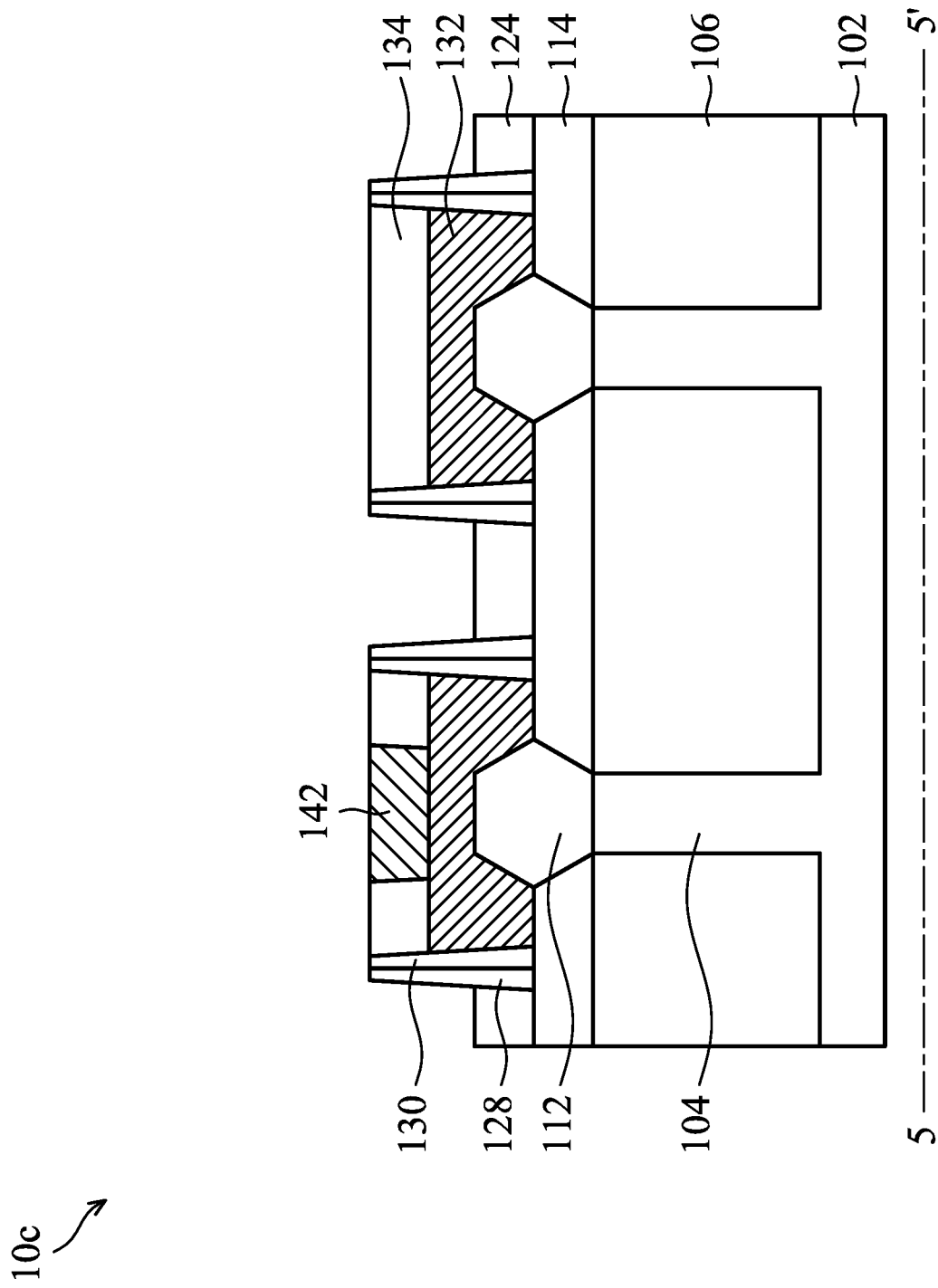

Next, the blocking layer 124 is recessed and the blocking structure 124 is formed, as shown in FIGS. 4C and 5C in accordance with some embodiments. In some embodiments, the top portion of the blocking layer 124 is removed. The processes of recessing the blocking layer 124 are the same as, or similar to, those used to recess the blocking layer 124 described in the previous embodiments. For the purpose of brevity, the descriptions of these processes are not repeated herein.

Afterwards, an etch stop layer 136 is deposited over the blocking structures 124, the contact structures 132, and the via structure 142 (not shown). In some embodiments, after depositing the etch stop layer 136, an air gap 138 is formed between the contact structures 132. In some embodiments, the air gap 138 is formed between the etch stop layer 136 and the blocking structures 124. The processes of forming the etch stop layer 136 is the same as, or similar to, those used to form the etch stop layer 136 described in the previous embodiments. For the purpose of brevity, the descriptions of these processes are not repeated herein.

Figure 4D:
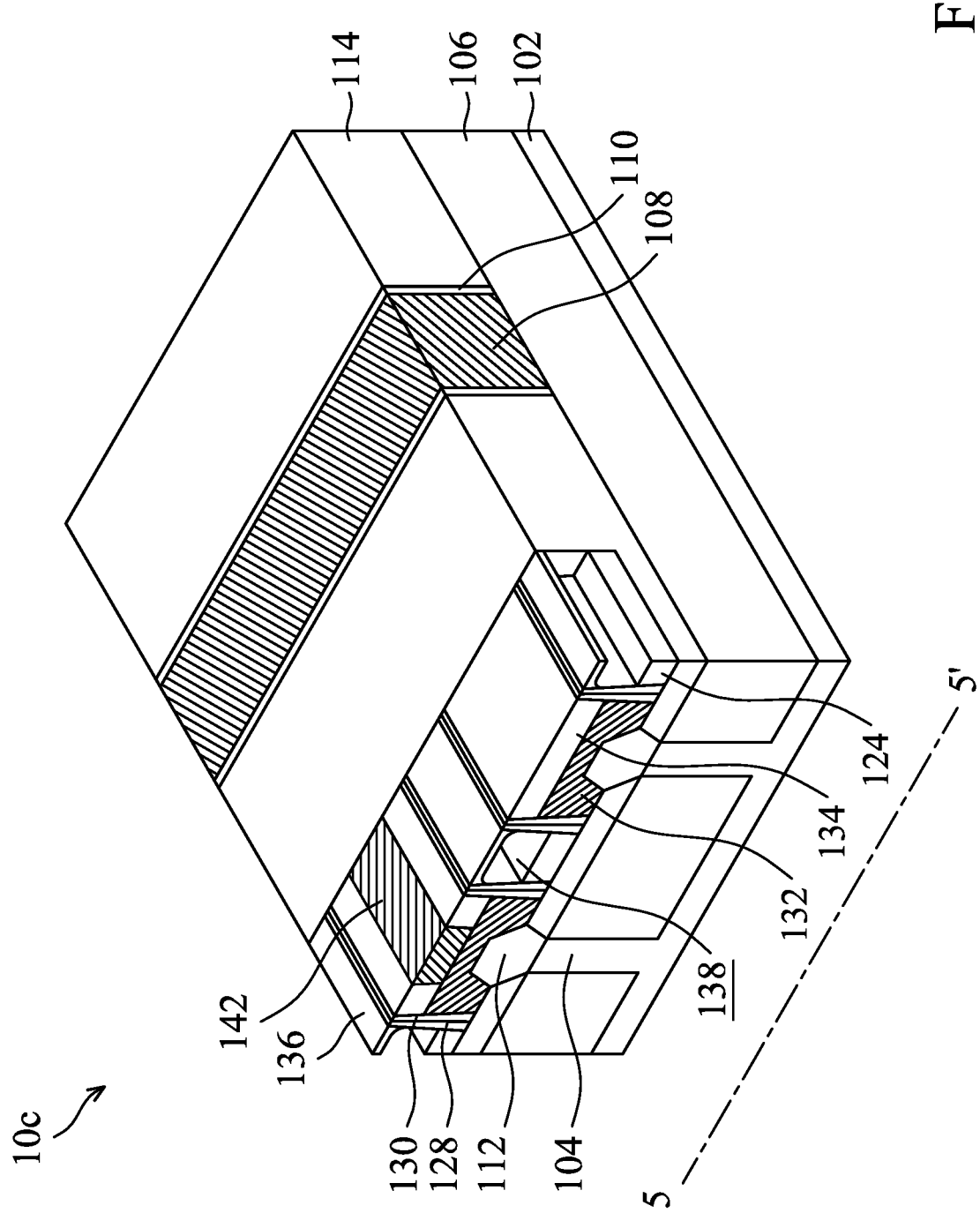
Figure 5D:
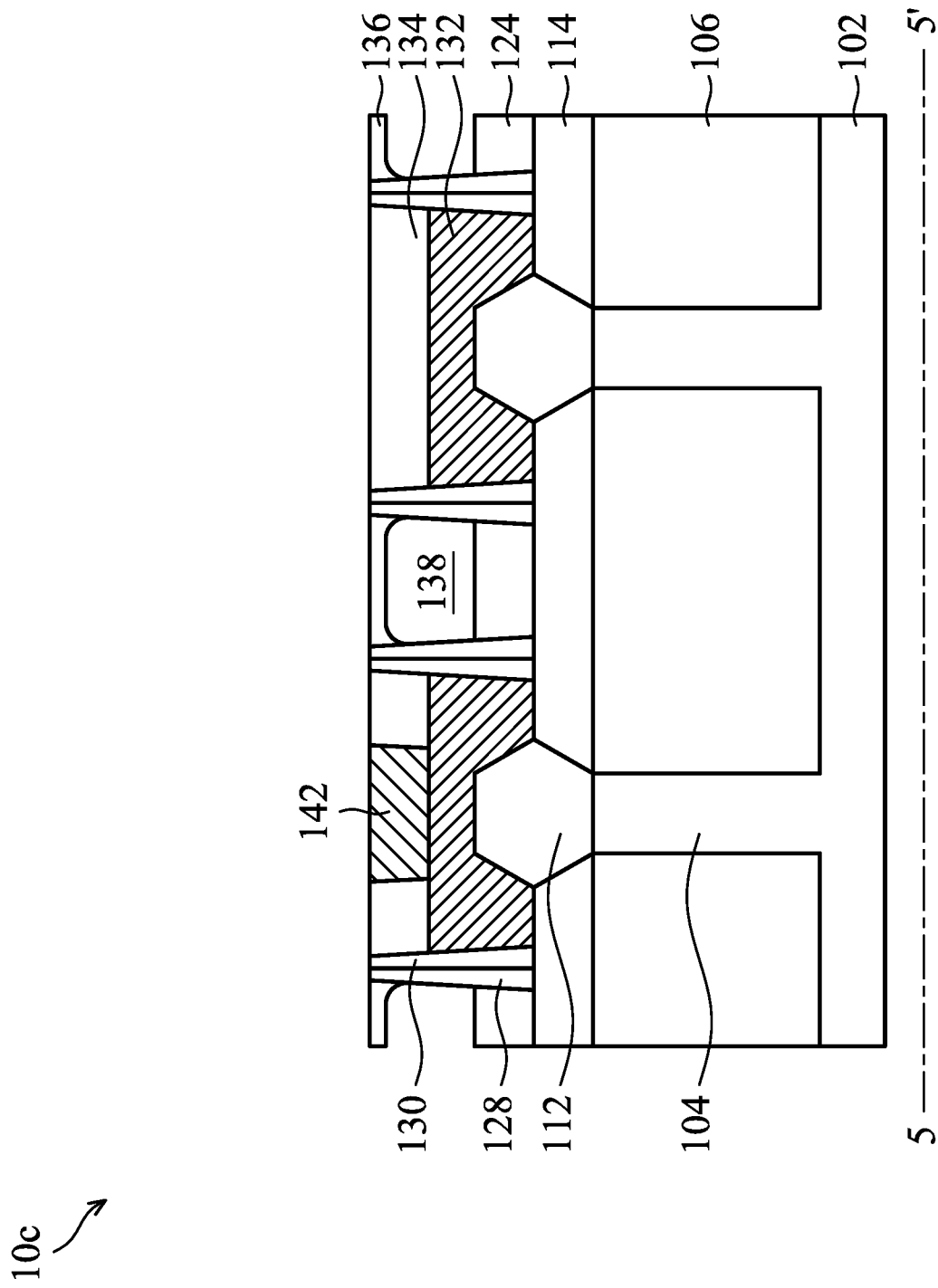

Afterwards, a planarizing process is performed on the etch stop layer 136 until the top surface of the via structure 142 is exposed, as shown in FIGS. 4D and 5D in accordance with some embodiments. After the planarizing process, the top surface of the etch stop layer 136 may be substantially level with the top surfaces of the via structure 142. In some embodiments, the planarizing process includes a grinding process, a chemical mechanical polishing (CMP) process, an etching process, another applicable process, or a combination thereof.

With an air gap 138 formed between the contact structures 132, the capacitance between the contact structures 132 and the capacitance between the via structure 142 and the contact structure 132 may be reduced. In addition, the leakage path between the contact structures 132 may also be blocked by the air gap 138, and reliability may be improved. Since the contact structures 132 are formed by using the blocking structures 124 as thicker mask layers, the isolation between the contact structures 132 may be improved. Furthermore, by forming the via structure 142 prior to forming the air gap 138, the via structure 142 is smaller than that in the previous embodiments. Therefore, the resistance may be further reduced and the performance may be improved.

Figure 6:
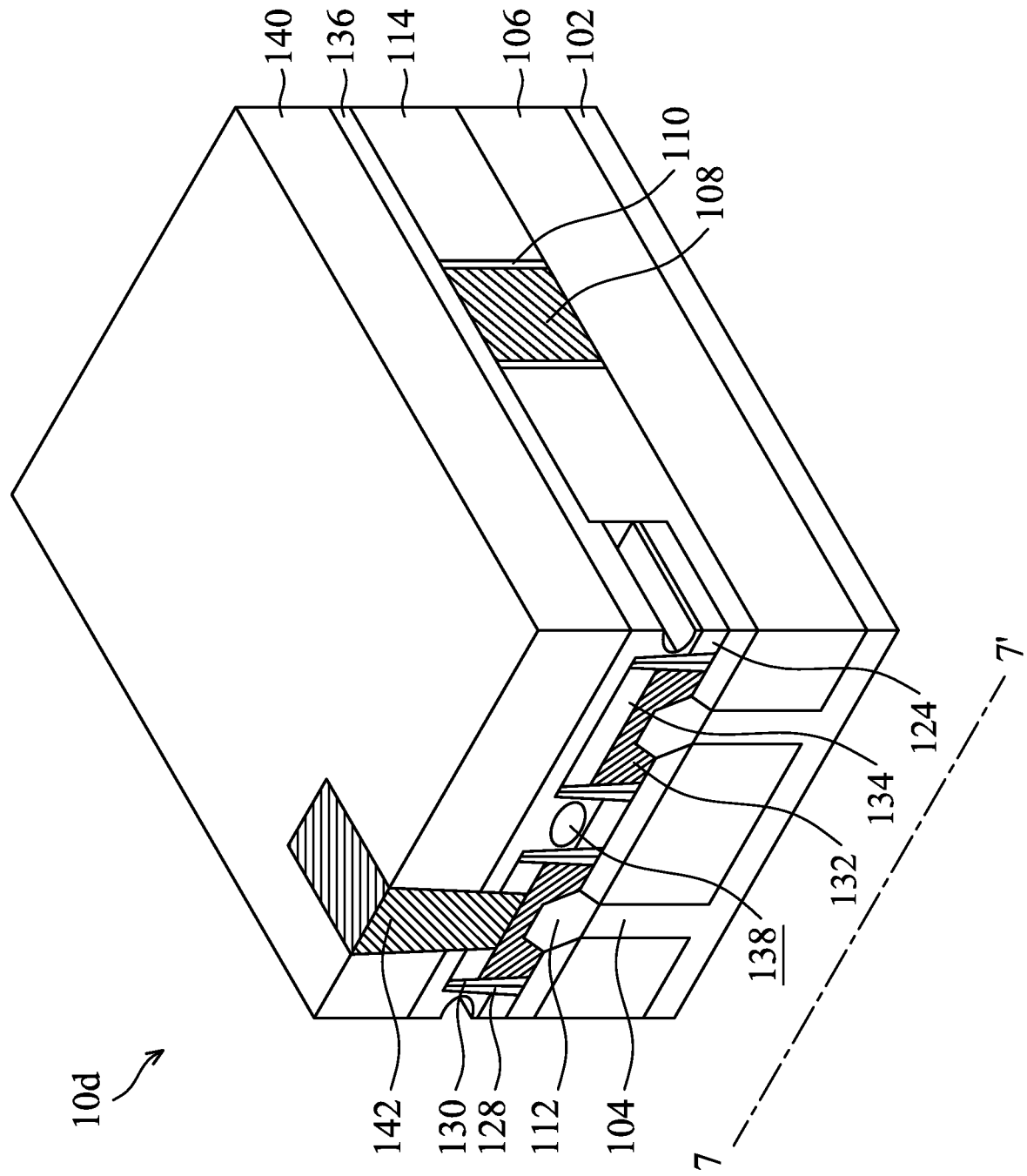
FIG. 6 is a perspective representation of a modified FinFET device structure, in accordance with some embodiments of the disclosure.

Many variations and/or modifications may be made to the embodiments of the disclosure. FIG. 6 is a perspective representation of forming a modified FinFET device structure 10*d*, in accordance with some embodiments of the disclosure. Some processes or devices are the same as, or similar to, those described in the embodiments above, and therefore the descriptions of these processes and devices are not repeated herein. The difference from the embodiments described above is that, as shown in FIGS. 6 and 7 in accordance with some embodiments, the air gap 138 is surrounded by the etch stop layer 136.

Figure 7:
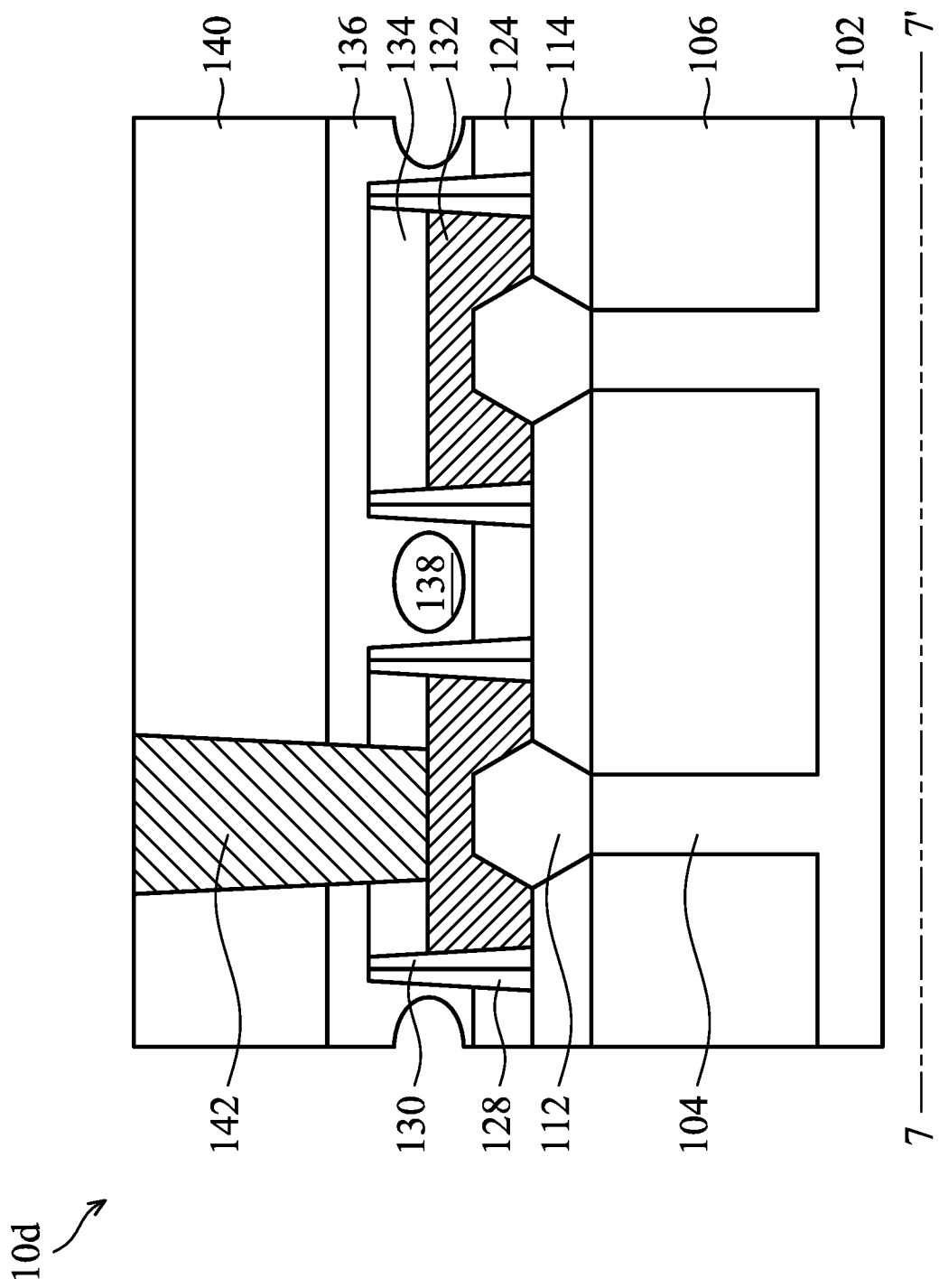
FIG. 7 is a cross-sectional representation of a modified FinFET device structure shown in FIG. 6, in accordance with some embodiments of the disclosure.

FIG. 6 is a perspective representation of forming the FinFET device structure 10d, and FIG. 7 shows a cross-sectional representation taken along line 7-7' in FIG. 6 in accordance with some embodiments.

While depositing the etch stop layer 136, the etch stop layer 136 covers the top surface of the blocking structure 124 and the sidewalls of the contact structures 132, as shown in FIGS. 6 and 7 in accordance with some embodiments. In some embodiments, the air gap 138 is formed inside the etch stop layer 136. The process for forming the air gap 138 surrounded by the etch stop layer 136 may be easier.

With an air gap 138 formed between the contact structures 132, the capacitance between the contact structures 132 and the capacitance between the via structure 142 and the contact structure 132 may be reduced. In addition, the leakage path between the contact structures 132 may also be blocked by the air gap 138, and reliability may be improved. Since the contact structures 132 are formed by using the blocking structures 124 as thicker mask layers, the isolation between the contact structures 132 may be improved. Furthermore, by forming the air gap 138 surrounded by the etch stop layer 136, the process of depositing the etch stop layer 136 may be easier.

Figure 8:
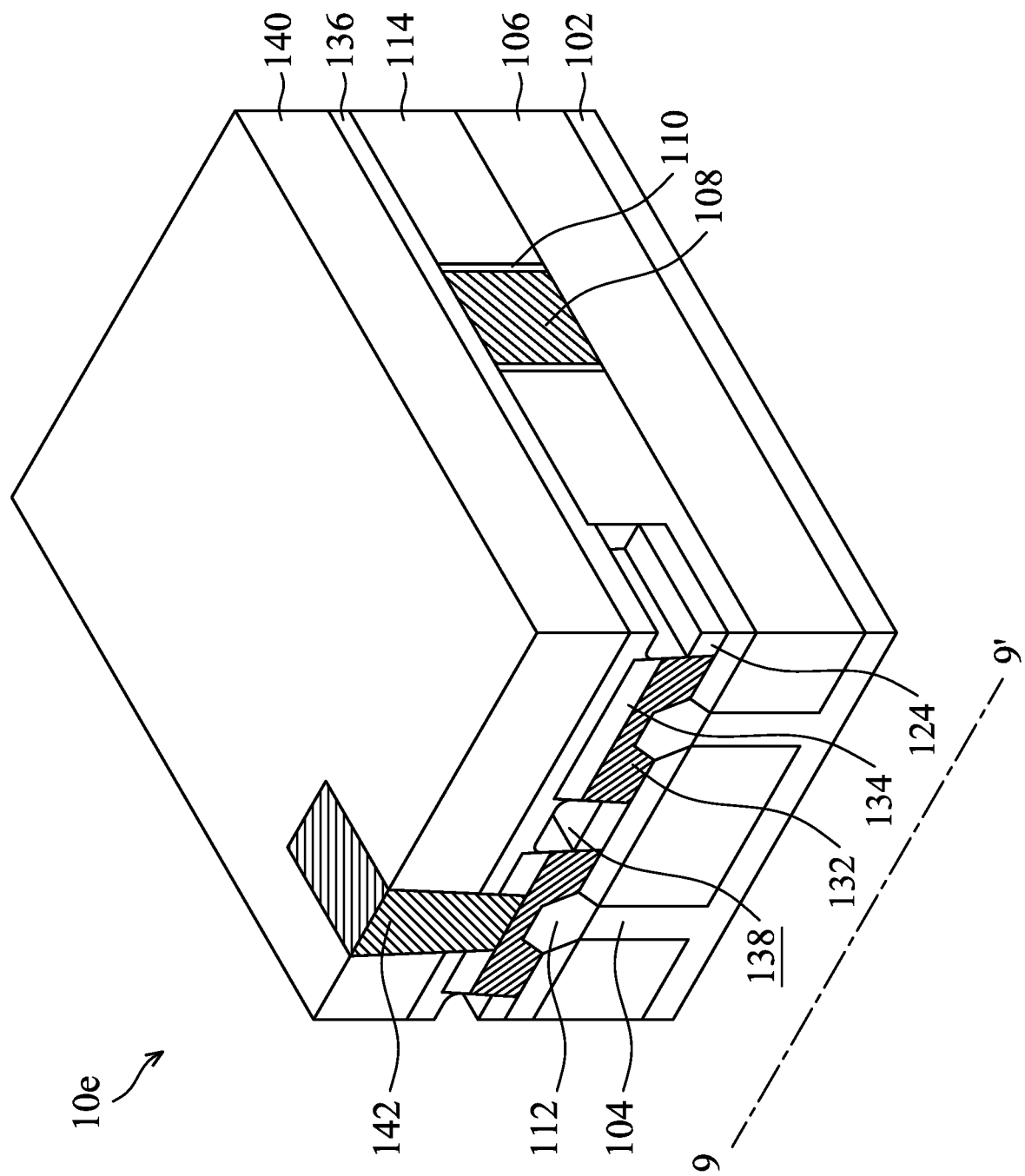
FIG. 8 is a perspective representation of a modified FinFET device structure, in accordance with some embodiments of the disclosure.

Many variations and/or modifications may be made to the embodiments of the disclosure. FIG. 8 is a perspective representation of forming a modified FinFET device structure 10e, in accordance with some embodiments of the disclosure. Some processes or devices are the same as, or similar to, those described in the embodiments above, and therefore the descriptions of these processes and devices are not repeated herein. The difference from the embodiments described above is that, as shown in FIGS. 8 and 9 in accordance with some embodiments, the blocking structure 124 is in direct contact with the contact structures 132, and the liner layer 130 and the dielectric layer 128 are not formed over the sidewalls of the blocking structure 124.

Figure 9:
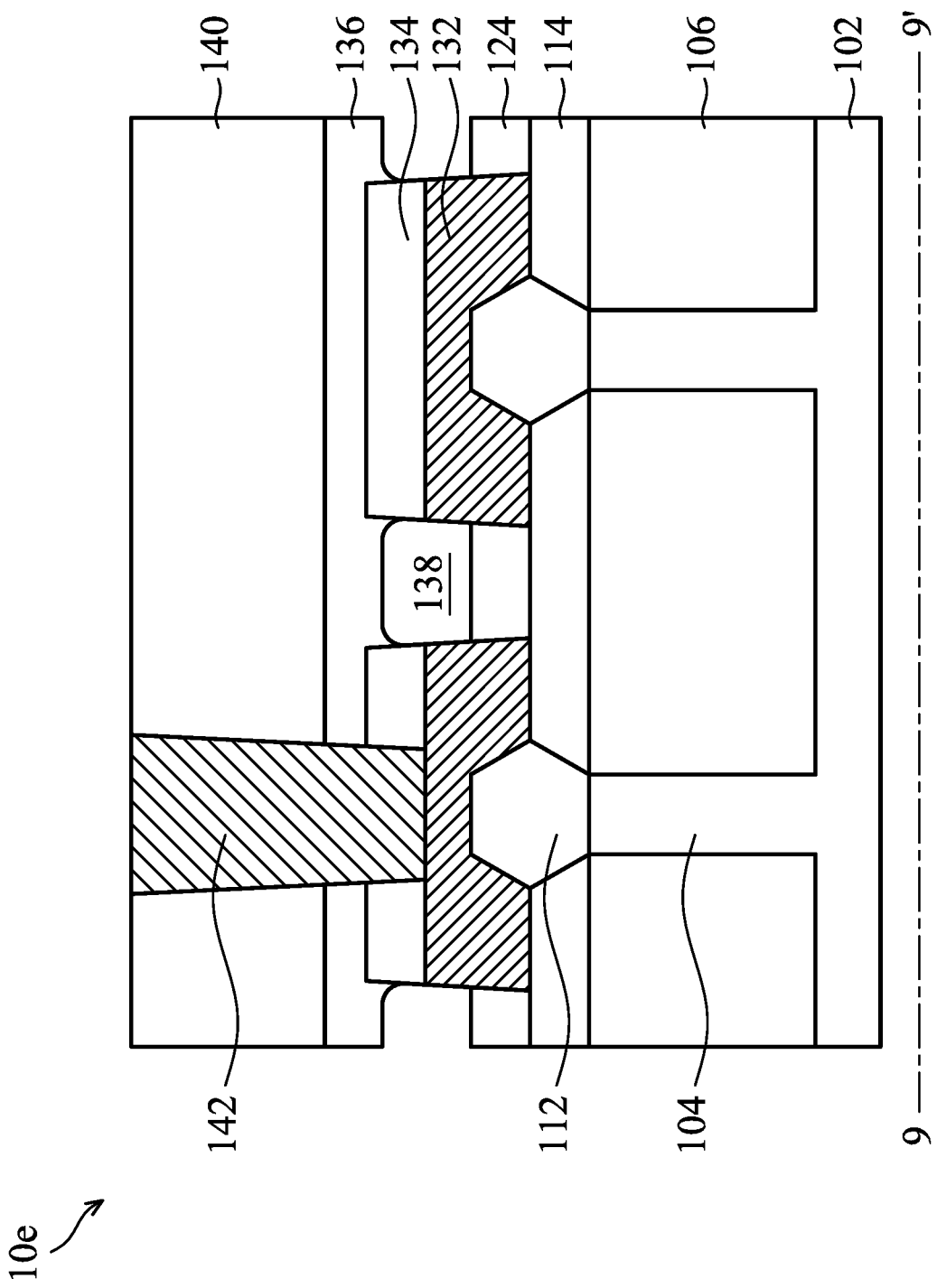
FIG. 9 is a cross-sectional representation of a modified FinFET device structure shown in FIG. 8, in accordance with some embodiments of the disclosure.

FIG. 8 is a perspective representation of forming the FinFET device structure 10e, and FIG. 9 shows a cross-sectional representation taken along line 9-9' in FIG. 8 in accordance with some embodiments.

After forming the blocking layer 124 between the source/drain epitaxial structures 112, the first ILD structure 114 and the second ILD structure 116 over the source/drain epitaxial structure 112 are completely removed, as shown in FIGS. 8 and 9 in accordance with some embodiments. Moreover, the contact structures 132 are in direct contact with the blocking structure 124. In some embodiments, since the liner layer 130 and the dielectric layer 128 are not formed over the sidewalls of the blocking structure 124, the contact structure 132 has an upwardly tapered trapezoid shapes in a cross-sectional view. Without forming the liner layer 130, the production time and cost may be saved.

With an air gap 138 formed between the contact structures 132, the capacitance between the contact structures 132 and the capacitance between the via structure 142 and the contact structure 132 may be reduced. In addition, the leakage path between the contact structures 132 may also be blocked by the air gap 138, and reliability may be improved. Since the contact structures 132 are formed by using the blocking structures 124 as thicker mask layers, the isolation between the contact structures 132 may be improved. Furthermore, by forming the contact structures 132 directly in direct contact with the blocking structure 124, the production time and cost may be saved.

Figure 10:
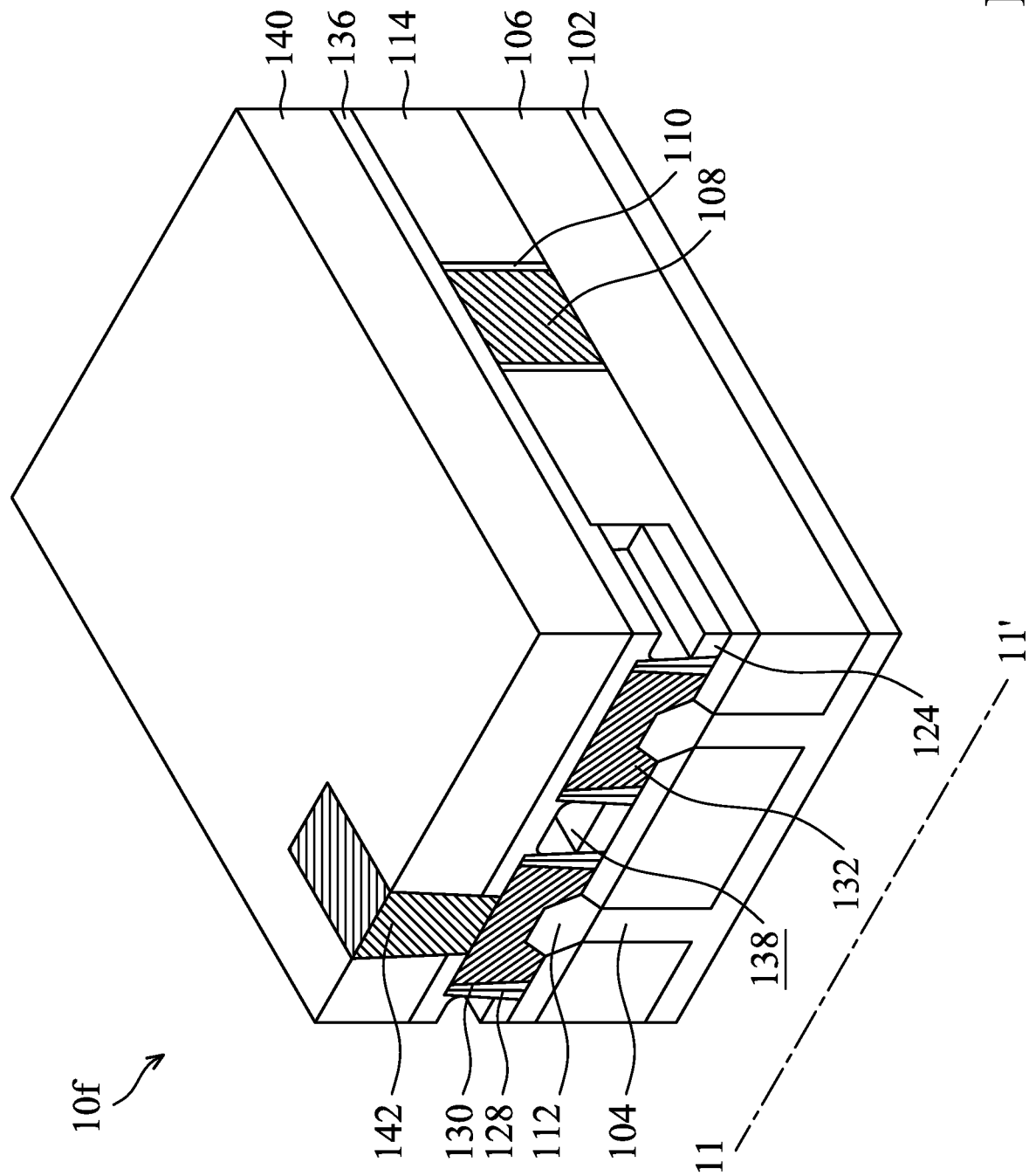
FIG. 10 is a perspective representation of a modified FinFET device structure, in accordance with some embodiments of the disclosure.

Many variations and/or modifications may be made to the embodiments of the disclosure. FIG. 10 is a perspective representation of forming a modified FinFET device structure 10f, in accordance with some embodiments of the disclosure. Some processes or devices are the same as, or similar to, those described in the embodiments above, and therefore the descriptions of these processes and devices are not repeated herein. The difference from the embodiments described above is that, as shown in FIGS. 10 and 11 in accordance with some embodiments, the etch stop layer 136 is directly formed over the contact structures 132 and the cap layer 134 over the contact structures 132 is not formed.

Figure 11:
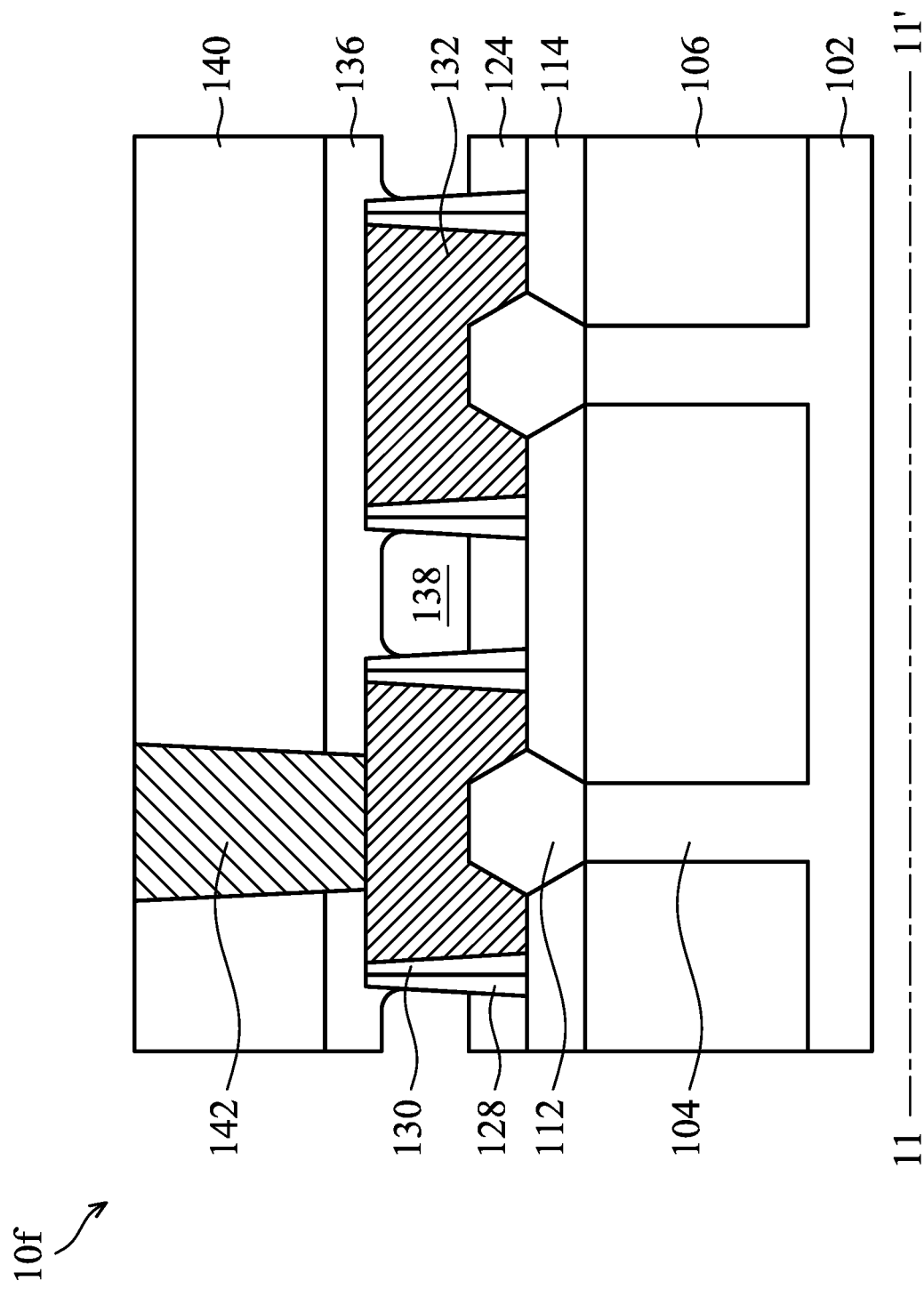
FIG. 11 is a cross-sectional representation of a modified FinFET device structure shown in FIG. 10, in accordance with some embodiments of the disclosure.

FIG. 10 is a perspective representation of forming the FinFET device structure 10f, and FIG. 11 shows a cross-sectional representation taken along line 11-11' in FIG. 10 in accordance with some embodiments.

After forming the contact structures 132 over the source/drain epitaxial structures 112, the etch stop layer 136 is formed over the contact structures 132 and the blocking structure 124, and the etch stop layer 136 is in direct contact with the contact structures 132, as shown in FIGS. 10 and 11 in accordance with some embodiments. In addition, the via structure 142 are formed only through the hard mask layer 140 and the etch stop layer 136. Without forming the cap layer 134, the production time and cost may be saved.

With an air gap 138 formed between the contact structures 132, the capacitance between the contact structures 132 and the capacitance between the via structure 142 and the contact structure 132 may be reduced. In addition, the leakage path between the contact structures 132 may also be blocked by the air gap 138, and reliability may be improved. Since the contact structures 132 are formed by using the blocking structures 124 as thicker mask layers, the isolation between the contact structures 132 may be improved. Furthermore, by forming the etch stop layer 136 in direct contact with the contact structures 132, the production time and cost may be saved.

Figure 12:
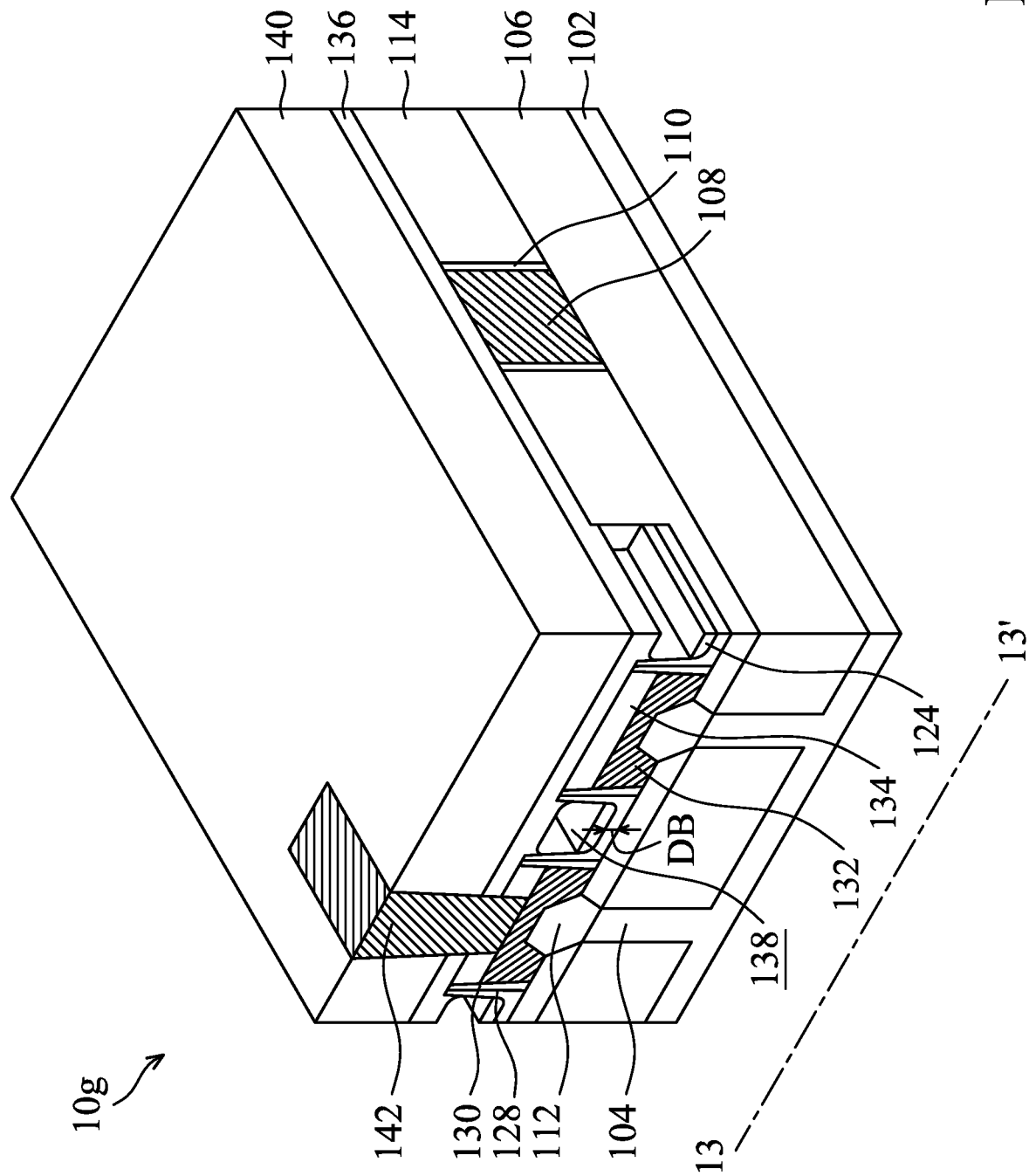
FIG. 12 is a perspective representation of a modified FinFET device structure, in accordance with some embodiments of the disclosure.

Many variations and/or modifications may be made to the embodiments of the disclosure. FIG. 12 is a perspective representation of forming a modified FinFET device structure 10g, in accordance with some embodiments of the disclosure. Some processes or devices are the same as, or similar to, those described in the embodiments above, and therefore the descriptions of these processes and devices are not repeated herein. The difference from the embodiments described above is that, as shown in FIGS. 12 and 13 in accordance with some embodiments, the bottom surface of the blocking structure 124 is higher than the bottom surface of the contact structure 132.

Figure 13:
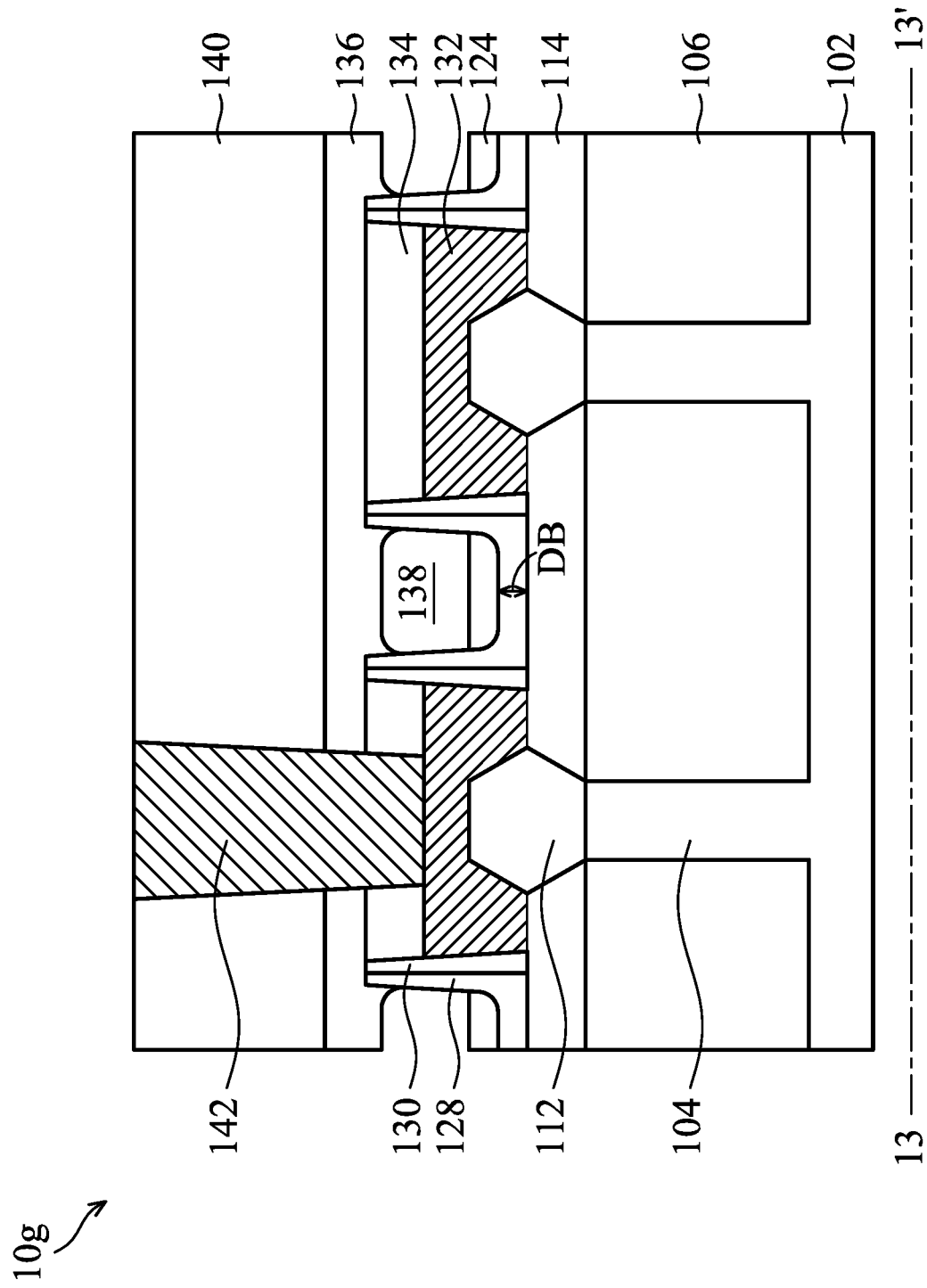
FIG. 13 is a cross-sectional representation of a modified FinFET device structure shown in FIG. 12, in accordance with some embodiments of the disclosure.

FIG. 12 is a perspective representation of forming the FinFET device structure 10g, and FIG. 13 shows a cross-sectional representation taken along line 13-13' in FIG. 12 in accordance with some embodiments.

While forming the opening 122, a bottom portion of the first ILD structure 114 between the source/drain epitaxial structures 112 is left and not removed. The dielectric layer 128 is formed on the bottom of the opening 122 and then the blocking structure 124 is formed in the opening 122. While forming the trench 126, the bottom surface of the trench 126 is lower than the bottom surface of the blocking structure 124, and the contact structure 132 is formed in the trench 126. Therefore, the bottom surface of the blocking structure 124 is higher than the bottom surface of the contact structure 132, as shown in FIGS. 12 and 13 in accordance with some embodiments. In this way, a thicker dielectric layer 128 between the contact structures 132 may help to protect the structures beneath the blocking structure 124.

In some embodiments, the distance DB between the bottom surface of the blocking structure 124 and the bottom surface of the contact structure 132 is in a range from about 0.5 nm to 50 nm. If the distance DB is too long, the air gap 138 may be too small, and the capacitance between the contact structures 132 may increase. If the distance DB is too short, the structure beneath the blocking structure 124 may not be well protected.

With an air gap 138 formed between the contact structures 132, the capacitance between the contact structures 132 and the capacitance between the via structure 142 and the contact structure 132 may be reduced. In addition, the leakage path between the contact structures 132 may also be blocked by the air gap 138, and reliability may be improved. Since the contact structures 132 are formed by using the blocking structures 124 as thicker mask layers, the isolation between the contact structures 132 may be improved. Furthermore, by making the bottom surface of the blocking structure 124 higher than the bottom surface of the contact structure 132, the structures beneath the blocking structure 124 may be protected.

Figure 14:
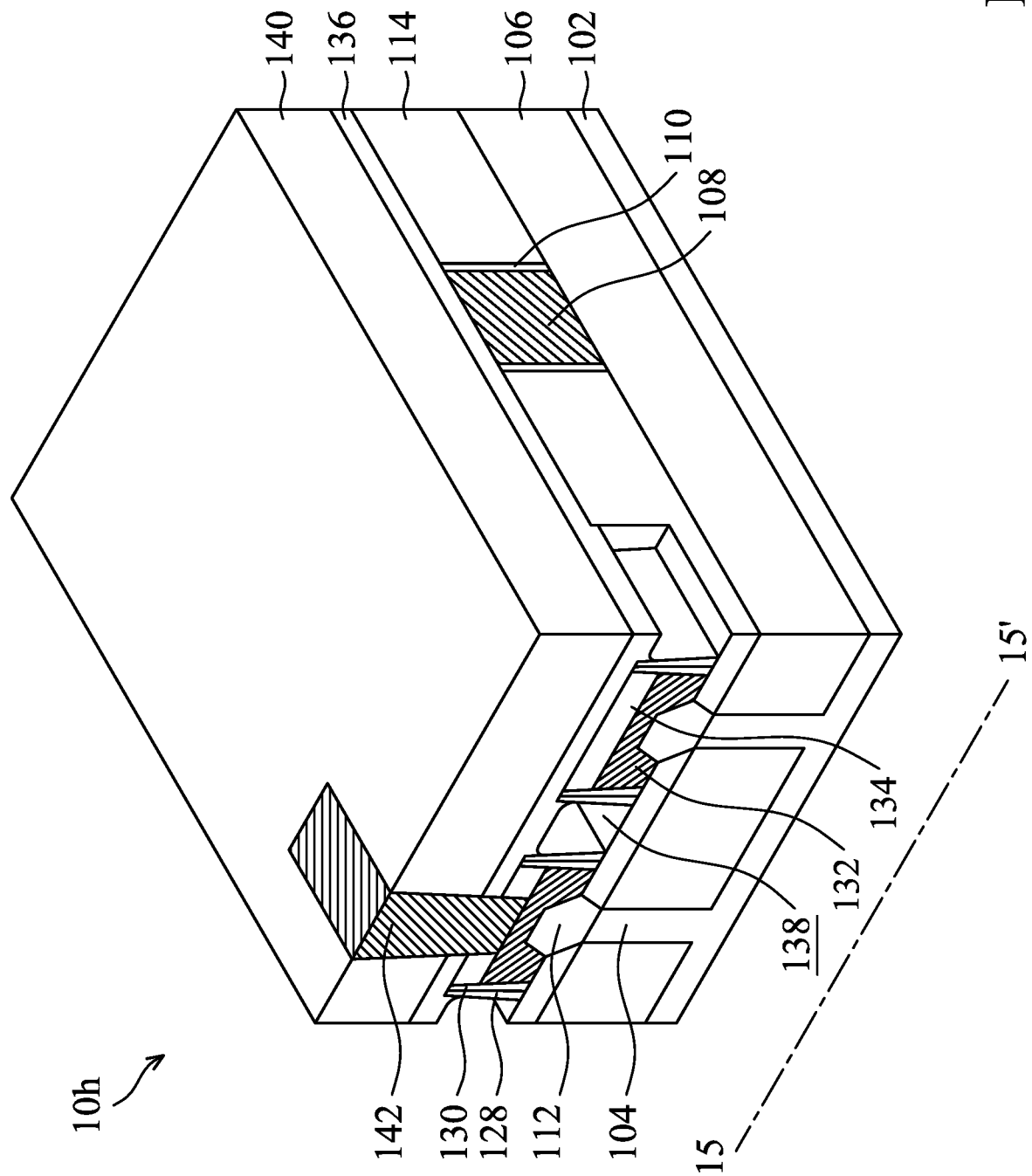
FIG. 14 is a perspective representation of a modified FinFET device structure, in accordance with some embodiments of the disclosure.

Many variations and/or modifications may be made to the embodiments of the disclosure. FIG. 14 is a perspective representation of forming a modified FinFET device structure 10h, in accordance with some embodiments of the disclosure. Some processes or devices are the same as, or similar to, those described in the embodiments above, and therefore the descriptions of these processes and devices are not repeated herein. The difference from the embodiments described above is that, as shown in FIGS. 14 and 15 in accordance with some embodiments, the blocking structure 124 is completely removed.

Figure 15:
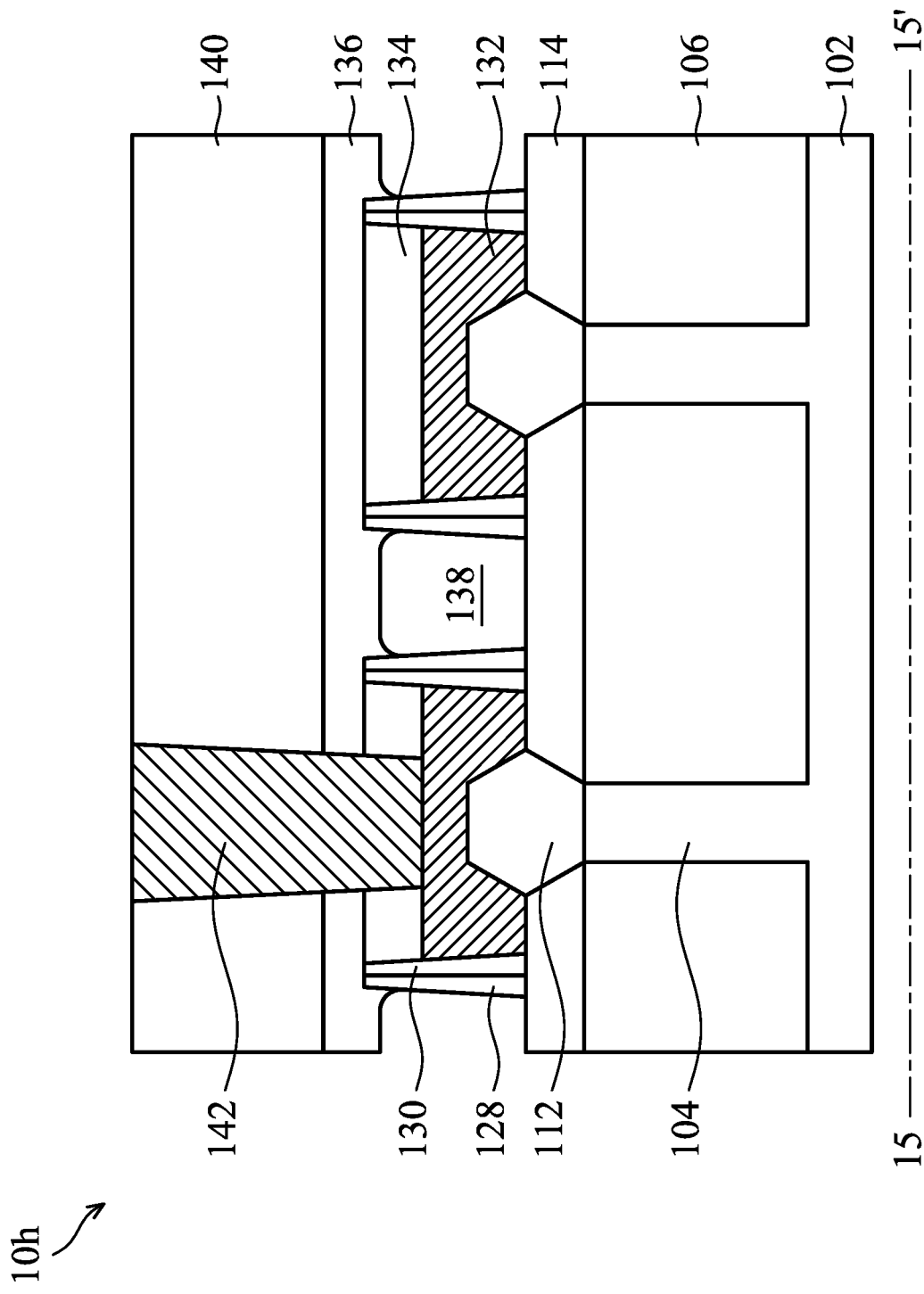
FIG. 15 is a cross-sectional representation of a modified FinFET device structure shown in FIG. 14, in accordance with some embodiments of the disclosure.

FIG. 14 is a perspective representation of forming the FinFET device structure 10h, and FIG. 15 shows a cross-sectional representation taken along line 15-15' in FIG. 14 in accordance with some embodiments.

While recessing the blocking structure 124, not only the top portion of the blocking structure 124 is removed, but the remaining blocking structure 124 is also removed, as shown in FIGS. 14 and 15 in accordance with some embodiments. In other words, the whole blocking structure 124 is removed. Therefore, the air gap 138 between the contact structures 132 is enlarged, and the capacitance between the contact structures 132 may be further reduced.

With an air gap 138 formed between the contact structures 132, the capacitance between the contact structures 132 and the capacitance between the via structure 142 and the contact structure 132 may be reduced. In addition, the leakage path between the contact structures 132 may also be blocked by the air gap 138, and reliability may be improved. Since the contact structures 132 are formed by using the blocking structures 124 as thicker mask layers, the isolation between the contact structures 132 may be improved. Furthermore, by completely removing the blocking structures 124 between the contact structures 132, the capacitance between the contact structures 132 may be further reduced.

As described previously, the air gap 138 between the etch stop layer 136 and the blocking structure 124 may lower the capacitance. The air gap 138 between the contact structures 132 may also reduce the leakage and improve the reliability. The blocking structure 124 may also improve the isolation between the contact structures 132. In some embodiments as shown in FIGS. 4A-4D and 5A-5D, the resistance may be reduced with smaller via structure 142. In some embodiments as shown in FIGS. 6 and 7, the process may be easier when forming the air gap 138 surrounded by the etch stop layer 136. In some embodiments as shown in FIGS. 8 and 9, the production time and cost may be saved without forming the liner layer 130. In some embodiments as shown in FIGS. 10 and 11, the production time and cost may be saved without forming the cap layer 134. In some embodiments as shown in FIGS. 12 and 13, the structures beneath the blocking structure 124 may be protected with a dielectric layer 128 on the bottom surface of the opening 122. In some embodiments as shown in FIGS. 14 and 15, the capacitance may be reduced without the blocking structure 124 being formed between the contact structures 132.

Embodiments of a FinFET device structure and a method for forming the same are provided. The method for forming the FinFET device structure may include forming an air gap and a blocking structure between the contact structures. With the air gap, the capacitance between the contact structures may be reduced. Furthermore, the leakage path between the contact structures may be also blocked by the air gap and reliability may also be improved. The isolation between the contact structures may also be improved by using the blocking structure as a thicker mask layer while forming the contact structures.

In some embodiments, a method for forming a fin field effect transistor device structure is provided. The method for forming a fin field effect transistor device structure includes forming fin structures over a substrate. The method for forming a fin field effect transistor device structure also includes forming a gate structure across the fin structures. The method for forming a fin field effect transistor device structure also includes forming source/drain epitaxial structures over the fin structures. The method for forming a fin field effect transistor device structure also includes forming blocking structures between the source/drain epitaxial structures. The method for forming a fin field effect transistor device structure also includes depositing contact structures over the source/drain epitaxial structures and between the blocking structures. The method for forming a fin field effect transistor device structure also includes removing a top portion of the blocking structures. The method for forming a fin field effect transistor device structure also includes depositing an etch stop layer over the blocking structures and the contact structures, so that an air gap is formed between the etch stop layer and the blocking structure.

In some embodiments, a method for forming a fin field effect transistor device structure is provided. The method for forming a fin field effect transistor device structure includes forming fin structures over a substrate. The method for forming a fin field effect transistor device structure also includes forming a gate structure across the fin structures. The method for forming a fin field effect transistor device structure also includes forming source/drain epitaxial structures over the fin structures on opposite sides of the gate structure. The method for forming a fin field effect transistor device structure also includes forming a dielectric structure surrounding the source/drain epitaxial structures. The method for forming a fin field effect transistor device structure also includes forming blocking structures between the fin structures. The method for forming a fin field effect transistor device structure also includes depositing contact structures over the fin structures. The method for forming a fin field effect transistor device structure also includes forming a via structure electrically connected to the contact structures. The method for forming a fin field effect transistor device structure also includes removing a top portion of the blocking structures. The method for forming a fin field effect transistor device structure also includes depositing an etch stop layer over the blocking structures, the contact structures, and the via structure. An air gap is formed between the contact structures. The method for forming a fin field effect transistor device structure also includes planarizing the etch stop layer to expose the via structure.

In some embodiments, a fin field effect transistor device structure is provided. The fin field effect transistor device structure includes a first fin structure and a second fin structure formed over a substrate. The fin field effect transistor device structure also includes a gate structure formed across the first fin structure and the second fin structure. The fin field effect transistor device structure also includes a first source/drain epitaxial structure formed over the first fin structure and a second source/drain epitaxial structure formed over the second fin structure on opposite sides of the gate structure. The fin field effect transistor device structure also includes a dielectric structure formed surrounding the first fin structure and the second fin structure. The fin field effect transistor device structure also includes a blocking structure formed over the dielectric structure between the first fin structure and the second fin structure. The fin field effect transistor device structure also includes a first contact structure formed over the first fin structure and a second contact structure formed over the second fin structure. The fin field effect transistor device structure also includes an etching stop layer formed over the first contact structure, the second contact structure, and the blocking structure. An air gap is formed above the blocking structure and below the etching stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a fin field effect transistor device structure, comprising:
   forming fin structures over a substrate;
   forming a gate structure across the fin structures;
   forming source/drain epitaxial structures over the fin structures;
   forming blocking structures between the source/drain epitaxial structures;
   depositing contact structures over the source/drain epitaxial structures and between the blocking structures;
   removing a top portion of the blocking structures; and
   depositing an etch stop layer over the blocking structures and the contact structures, wherein an air gap is formed between the etch stop layer and the blocking structure, and wherein the etch stop layer and the blocking structure are separated by the air gap.

2. The method for forming the fin field effect transistor device structure as claimed in claim 1, further comprising:
   forming a liner layer over sidewalls of the blocking structures before depositing the contact structure.

3. The method for forming the fin field effect transistor device structure as claimed in claim 1, further comprising:
   removing a top portion of the contact structures; and
   forming a cap layer over the contact structures.

4. The method for forming the fin field effect transistor device structure as claimed in claim 1, wherein forming the blocking structures comprises:
   forming a dielectric layer surrounding the source/drain epitaxial structures;
   removing a portion of the dielectric layer between the source/drain epitaxial structures;
   filling a blocking material between the source/drain epitaxial structures; and
   removing the dielectric layer over the source/drain epitaxial structures to form trenches,
   wherein the contact structures are formed in the trenches and the dielectric layer is remain over sidewalls of the blocking material.

5. The method for forming the fin field effect transistor device structure as claimed in claim 4, wherein a bottom portion the dielectric layer is left between the source/drain epitaxial structures.

6. The method for forming the fin field effect transistor device structure as claimed in claim 4, wherein the blocking structures and the source/drain epitaxial structures are separated by the dielectric layer.

7. The method for forming the fin field effect transistor device structure as claimed in claim 1, further comprising:
   removing remaining portions of the blocking structures.

8. The method for forming the fin field effect transistor device structure as claimed in claim 1, wherein the source/drain epitaxial structures are surrounded by the contact structures.

9. A method for forming a fin field effect transistor device structure, comprising:
   forming fin structures over a substrate;
   forming a gate structure across the fin structures;
   forming source/drain epitaxial structures over the fin structures on opposite sides of the gate structure;
   forming a dielectric structure surrounding the source/drain epitaxial structures;
   forming blocking structures between the fin structures;
   depositing contact structures over the fin structures;
   forming a via structure over a top surface of the contact structure and electrically connected to the contact structures;
   removing a top portion of the blocking structures; and
   depositing an etch stop layer over the blocking structures, the contact structures, and the via structure, wherein an air gap is formed between the contact structures; and
   planarizing the etch stop layer to expose the via structure.

10. The method for forming the fin field effect transistor device structure as claimed in claim 9, further comprising:
    forming a dielectric layer over sidewalls of the blocking structures.

11. The method for forming the fin field effect transistor device structure as claimed in claim 10, wherein an angle between a sidewall of the dielectric layer and a bottom surface of the dielectric layer is in a range from about 70° to about 89°.

12. The method for forming the fin field effect transistor device structure as claimed in claim 10, further comprising:
    forming a dielectric cap layer over the contact structures,
    wherein the dielectric cap layer and the dielectric layer are made of different materials.

13. The method for forming the fin field effect transistor device structure as claimed in claim 9, further comprising:
    depositing a sacrificial etch stop layer over the blocking structures and the contact structures;
    depositing a hard mask layer over the sacrificial etch stop layer before forming the via structure; and removing the sacrificial etch stop layer and the hard mask layer after forming the via structure.

14. The method for forming the fin field effect transistor device structure as claimed in claim 13, wherein the sacrificial etch stop layer and the hard mask layer are made of different materials.

15. A method for forming a fin field effect transistor device structure, comprising:
- forming a first fin structure and a second fin structure over a substrate;
- forming a gate structure across the first fin structure and the second fin structure;
- growing a first source/drain epitaxial structure over the first fin structure and a second source/drain epitaxial structure over the second fin structure over opposite sides of the gate structure;
- depositing a dielectric layer covering the first source/drain epitaxial structure and the second source/drain epitaxial structure;
- forming a blocking structure between the first source/drain epitaxial structure and the second source/drain epitaxial structure;
- removing the dielectric layer over the first source/drain epitaxial structure and the second source/drain epitaxial structure to expose the first source/drain epitaxial structure and the second source/drain epitaxial structure;
- forming a first contact structure over the first source/drain epitaxial structure and a second contact structure over the second source/drain epitaxial structure;
- recessing the blocking structure between the first source/drain epitaxial structure and the second source/drain epitaxial structure;
- depositing an etching stop layer over the first contact structure, the second contact structure, and the blocking structure;
- forming a hard mask layer formed over the etching stop layer; and
- forming a via structure through the hard mask layer and the etching stop layer,
- wherein an air gap is formed below the etching stop layer and between the first contact structure and the second contact structure, and wherein the via structure is in direct contact with the first contact structure.

16. The method for forming the fin field effect transistor device structure as claimed in claim 15, further comprising:
- forming a liner layer over sidewalls of the first contact structure and the second contact structure,
- wherein the liner layer and the dielectric layer are made of different materials.

17. The method for forming the fin field effect transistor device structure as claimed in claim 16, wherein after removing the dielectric layer, the dielectric layer remains over the liner layer.

18. The method for forming the fin field effect transistor device structure as claimed in claim 15, wherein the dielectric layer between the first source/drain epitaxial structure and the second source/drain epitaxial structure is partially removed.

19. The method for forming the fin field effect transistor device structure as claimed in claim 18, wherein a bottom surface of the blocking layer is higher than a bottom surface of the first contact structure.

20. The method for forming the fin field effect transistor device structure as claimed in claim 15, wherein the blocking structure between the first source/drain epitaxial structure and the second source/drain epitaxial structure is further recessed until the dielectric layer is exposed.

* * * * *